US012629725B2

(12) United States Patent
Hu et al.

(10) Patent No.: US 12,629,725 B2
(45) Date of Patent: May 19, 2026

(54) METHOD AND SINGLE WAFER PROCESSING SYSTEM FOR PROCESSING OF SEMICONDUCTOR WAFERS

(71) Applicant: Tokyo Electron Limited, Tokyo (JP)

(72) Inventors: Shan Hu, Albany, NY (US); Peter D'Elia, Albany, NY (US); Ronald Nasman, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 114 days.

(21) Appl. No.: 18/806,852

(22) Filed: Aug. 16, 2024

(65) Prior Publication Data

US 2024/0399422 A1 Dec. 5, 2024

Related U.S. Application Data

(62) Division of application No. 18/192,279, filed on Mar. 29, 2023, now Pat. No. 12,103,052.

(Continued)

(51) Int. Cl.
*B08B 3/02* (2006.01)
*B08B 13/00* (2006.01)
(Continued)

(52) U.S. Cl.
CPC ............... *B08B 3/02* (2013.01); *B08B 13/00* (2013.01); *F26B 5/005* (2013.01); *H10P 70/20* (2026.01);
(Continued)

(58) Field of Classification Search
CPC ..... B08B 3/02; B08B 13/00; B08B 2203/007; F26B 5/005; H01L 21/02057;
(Continued)

(56) References Cited

U.S. PATENT DOCUMENTS 5,294,259 A 3/1994 Canestaro et al.
6,239,038 B1 5/2001 Wen
(Continued)

FOREIGN PATENT DOCUMENTS

JP 2003318152 11/2003
JP 2003318152 A * 11/2003 ....... H01L 21/68728
(Continued)

OTHER PUBLICATIONS

Machine translation of JP-2003318152-A used for citation (Year: 2003).*

(Continued)

*Primary Examiner* — Erin F Bergner
(74) *Attorney, Agent, or Firm* — Egan, Enders & Huston LLP.

(57) ABSTRACT

Improved processing systems and methods are provided for wet and dry processing of a semiconductor wafer. Provided is an enclosed chamber for processing a semiconductor wafer within a processing space and a drainage system for directing processing fluids out of the processing space. The enclosed chamber includes a top plate and a bottom plate, which physically confine the processing fluids within a relatively small, enclosed processing space. This forces the processing fluids to flow radially across the wafer surface(s) without the need to rotate the wafer. The drainage system contains a conduit that is downstream from the processing space and configured to retain a portion of a processing fluid dispensed within the processing space. The portion retained within the conduit provides a pressure resistance against the processing fluid(s) dispensed within the processing space to improve wet and dry processing of the wafer surfaces.

18 Claims, 14 Drawing Sheets

Related U.S. Application Data

(60) Provisional application No. 63/351,922, filed on Jun. 14, 2022.

(51) Int. Cl.

| | |
|---|---|
| *F26B 5/00* | (2006.01) |
| *H10P 70/00* | (2026.01) |
| *H10P 72/00* | (2026.01) |

(52) U.S. Cl.
CPC .... *H10P 72/0406* (2026.01); *B08B 2203/007* (2013.01)

(58) Field of Classification Search
CPC ......... H01L 21/67028; H01L 21/67051; H01L 21/67057; H01L 21/6708; H01L 21/67086; H10P 70/20; H10P 72/0406; H10P 72/0414; H10P 72/0416; H10P 72/0424; H10P 72/0426; H10P 72/0408; H10P 72/0432; H10P 72/0604
See application file for complete search history.

(56) References Cited

U.S. PATENT DOCUMENTS

| | | | |
|---|---|---|---|
| 7,354,484 | B2 | 4/2008 | Orii et al. |
| 7,712,475 | B2 | 5/2010 | Fukuda et al. |
| 7,938,906 | B2 | 5/2011 | Wen |
| 8,813,764 | B2 | 8/2014 | Magni et al. |
| 2002/0064963 | A1 | 5/2002 | Gotoh et al. |
| 2002/0066465 | A1 | 6/2002 | Gotoh et al. |
| 2005/0178401 | A1* | 8/2005 | Boyers ................... A61L 2/183 216/57 |
| 2008/0236634 | A1 | 10/2008 | Moriya et al. |
| 2012/0260949 | A1* | 10/2012 | Sekiguchi .......... H10P 72/0414 134/99.1 |
| 2022/0005709 | A1 | 1/2022 | Takebayashi |
| 2023/0405642 | A1 | 12/2023 | Hu et al. |

FOREIGN PATENT DOCUMENTS

| | | |
|---|---|---|
| JP | 2021125576 | 8/2021 |
| WO | 2020189892 | 9/2020 |
| WO | 2020213852 | 10/2020 |

OTHER PUBLICATIONS

Hu et al., "Method And Single Wafer Processing System For Processing Of Semiconductor Wafers", KR Application No. 10-2025-7000086, Filed Jan. 2, 2025, KR Office Action dated Nov. 4, 2025, 6 pgs.

Search Report And The Written Opinion mailed Sep. 4, 2023, Application No. PCT/US2023/021714, Filed May 10, 2023, 8 pgs.

Hu et al., "Method and Single Wafer Processing System For Processing Of Semiconductor Wafers", JP Patent Application No. 2024-573532, JP Office Action dated Feb. 3, 2026, 7 pgs.

* cited by examiner

Air bubble

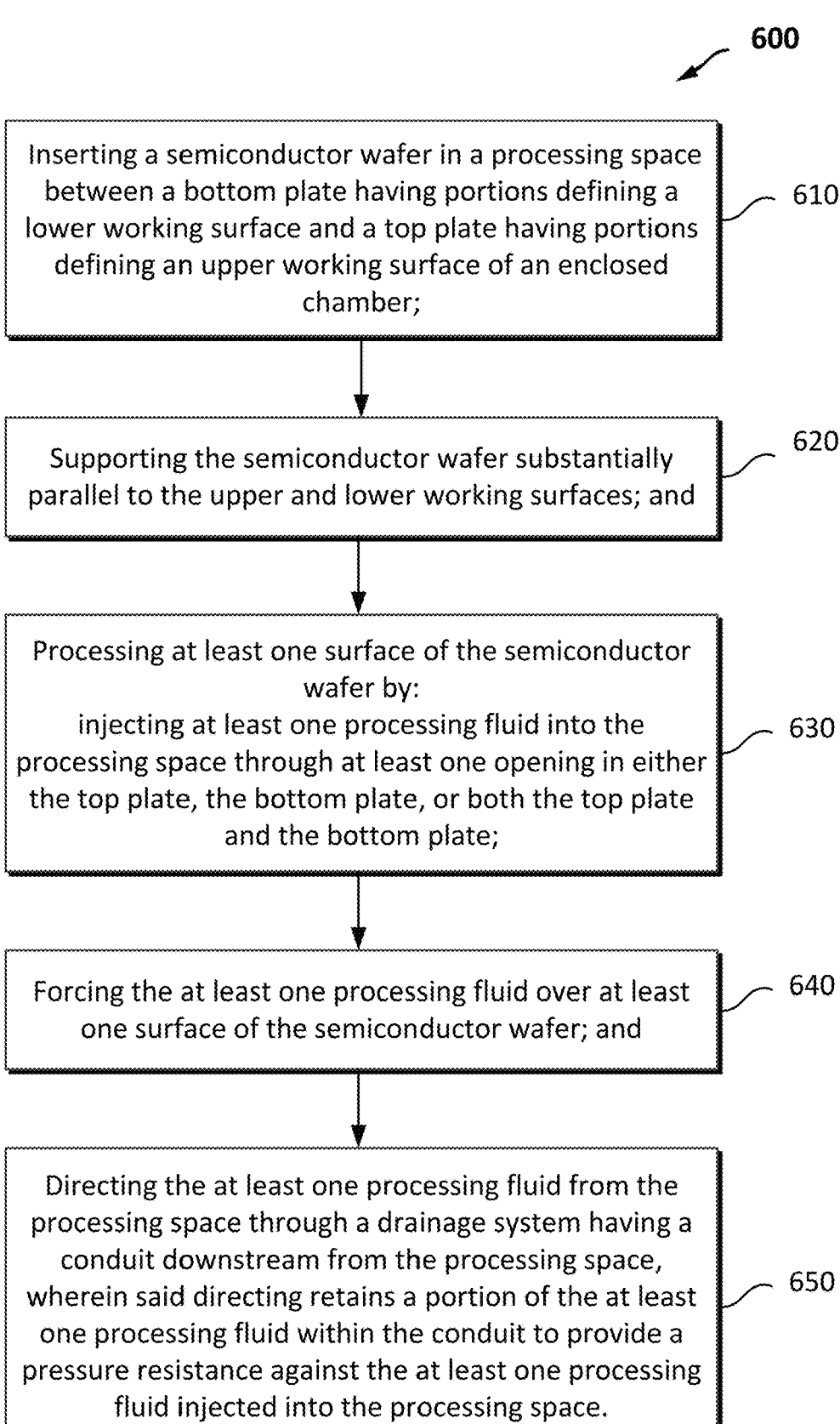

600

Inserting a semiconductor wafer in a processing space between a bottom plate having portions defining a lower working surface and a top plate having portions defining an upper working surface of an enclosed chamber; — 610

Supporting the semiconductor wafer substantially parallel to the upper and lower working surfaces; and — 620

Processing at least one surface of the semiconductor wafer by:
injecting at least one processing fluid into the processing space through at least one opening in either the top plate, the bottom plate, or both the top plate and the bottom plate; — 630

Forcing the at least one processing fluid over at least one surface of the semiconductor wafer; and — 640

Directing the at least one processing fluid from the processing space through a drainage system having a conduit downstream from the processing space, wherein said directing retains a portion of the at least one processing fluid within the conduit to provide a pressure resistance against the at least one processing fluid injected into the processing space. — 650

*FIG. 6*

METHOD AND SINGLE WAFER PROCESSING SYSTEM FOR PROCESSING OF SEMICONDUCTOR WAFERS

This application is a divisional of pending U.S. patent application Ser. No. 18/192,279, filed Mar. 29, 2023, which claims priority to U.S. Provisional Patent Application Ser. No. 63/351,922, filed Jun. 14, 2022, entitled "METHOD AND SINGLE WAFER PROCESSING SYSTEM FOR PROCESSING OF SEMICONDUCTOR WAFERS"; the disclosures of both of which are expressly incorporated herein, in their entirety, by reference.

TECHNICAL FIELD

This invention relates generally to the processing and surface preparation of semiconductor wafers and particularly to a method and processing system for both wet and dry processing of such wafers.

BACKGROUND

Integrated circuits are formed by using planar processes in which an ultraclean, flat wafer of silicon is used as a substrate upon which a large number of identical devices are built by various oxidation, photolithography, removal, ion bombardment and deposition processes. Surface preparation before and after the processes is critical for the patterning of microelectronics devices since device performance, reliability and product yield of silicon circuits are critically affected by the presence of chemical contaminants and particulate impurities on the wafer surface.

A variety of dry and wet processes are currently used for cleaning semiconductor wafer surfaces. Dry cleaning processes include steps for wafer cleaning and wafer drying using a gas exposure. Wet cleaning processes include a series of steps of immersing or spraying the wafers with a variety of liquids, including chemical solutions and rinse solutions. These wet and dry processes may be performed within a wide variety of processing chambers and systems.

Spin chambers are used to clean one or more surfaces of a semiconductor wafer using wet and dry processes. A spin chamber uses a spin chuck and drive mechanism (e.g., a stepper motor) to rotate or spin a semiconductor wafer mounted onto the spin chuck, at least one liquid nozzle for dispensing one or more liquids onto the wafer surface(s) while the semiconductor wafer is spinning, and a large cup for capturing the liquids that are ejected from the wafer surface(s) by the centrifugal forces generated during rotation of the spin chuck.

A variety of cleaning processes may be performed within a spin chamber. In one example cleaning process, a chemical solution is dispensed onto a surface of the semiconductor wafer, while the semiconductor wafer is spinning, to clean the wafer surface. After the cleaning step, a rinse solution is dispensed onto the wafer surface, while the semiconductor wafer is spinning, to remove the chemical solution and rinse the wafer surface. After the rinse step, wafer rotation may continue to spin-dry the wafer surface. In some cases, a puddle process may be performed between the wafer cleaning and rinse steps. In a puddle process, a chemical solution is dispensed onto the wafer surface while wafer rotation is stopped (or significantly slowed) to enable a puddle of the chemical solution to form on the wafer surface. In some cases, the puddle may reduce the amount of chemical needed to clean the wafer surface.

Conventional wet cleaning processes and processing chambers have several disadvantages. For example, spin chambers tend to be large and complicated, due to the need for a spin chuck, drive mechanism and large liquid capturing cup. In addition, current wet cleaning processes utilized within spin chambers typically require a large amount of ultrapure chemicals. The high cost and large amount of ultrapure chemicals required in current wet cleaning processes, and the treatment of hazardous waste resulting from such processes, together with its incompatibility with the advanced concepts of integrated processing such as cluster tooling, require new processing chambers and methods that are less affected by these limitations.

There is a strong need for an improved processing system and method to reduce chemical consumption, reduce processing steps, and increase equipment utilization without losing the effectiveness of the process. In particular, there is a need for an improved processing system and method for ultraclean surface preparation that is capable of performing both wet and dry processes.

SUMMARY

The present disclosure provides improved processing systems and methods for wet and dry processing of a semiconductor wafer. The processing systems and methods disclosed herein provide various advantages over conventional systems and methods for processing a semiconductor wafer. For example, the disclosed processing systems and methods provide an enclosed chamber for wet and dry processing of a semiconductor wafer. The enclosed chamber includes a top plate and a bottom plate, which physically confine the processing fluid(s) within a relatively small, enclosed processing space (PS). This forces the processing fluid(s) to flow radially across the wafer surface(s) without the need to rotate the wafer and results in a more compact chamber design. The top and bottom plates of the enclosed chamber also: (a) reduce the amount of processing fluid(s) needed to perform a process, (b) isolate the wafer from the environment, and (c) enable additional features and functionality (e.g., a sonic transducer, heating element, additional nozzle and/or sensor) to be utilized.

In addition to an enclosed chamber, the disclosed processing systems and methods provide a drainage system that improves wet and dry processing of a semiconductor wafer. The drainage system contains a conduit, which is positioned downstream from the processing space and configured to temporarily trap or retain at least a portion of a processing fluid dispensed within the processing space and directed through the conduit. The portion of the processing fluid retained within the conduit provides a pressure resistance against the processing fluid(s) dispensed within the processing space. This pressure resistance improves wet processing by providing a more uniform fluid flow velocity of the processing fluid as it spreads radially across the wafer surface. During dry processing, the pressure resistance provided by the processing fluid trapped within the conduit provides a more uniform radial removal of the processing fluid from the wafer surface.

According to one embodiment, a processing system is provided herein for processing a semiconductor wafer. The processing system described herein generally includes a chamber, in which the semiconductor wafer is processed. The chamber includes a bottom plate having portions defining a lower working surface inside the chamber and a top plate having portions defining an upper working surface inside the chamber. The upper working surface is spaced above the lower working surface.

The chamber further includes a processing space between the upper working surface and the lower working surface, at least one opening passing through the lower working surface and at least one opening passing through the upper working surface. The at least one opening passing through the lower working surface is configured to direct a processing fluid into the processing space above the lower working surface for processing a bottom surface of the semiconductor wafer. The at least one opening passing through the upper working surface is configured to direct the processing fluid into the processing space below the upper working surface for processing a top surface of the semiconductor wafer.

The chamber further includes a drainage system having a conduit downstream from the processing space for directing the processing fluid out of the processing space. As described in more detail below, the conduit is configured to retain a portion of the processing fluid within the conduit to provide a pressure resistance against the processing fluid directed into the processing space.

In some embodiments, the at least one opening passing through the lower working surface is centered in the bottom plate and the at least one opening passing through the upper working surface is centered in the top plate for directing the processing fluid into the processing space near a center of the semiconductor wafer. In such embodiments, the pressure resistance provided by the portion of the processing fluid retained within the conduit enables the processing fluid to flow across the top surface and the bottom surface of the semiconductor wafer at a uniform fluid velocity, from the center of the semiconductor wafer to an edge of the semiconductor wafer.

In some embodiments, the at least one opening passing through the lower working surface and the at least one opening passing through the upper working surface each comprise one or more nozzles, which are coupled to dispense the processing fluid into the processing space. For example, the at least one opening passing through the lower working surface may include a first backside nozzle centered in the bottom plate and a second backside nozzle positioned between a center of the bottom plate and an edge of the semiconductor wafer. Likewise, the at least one opening passing through the upper working surface may include a first frontside nozzle centered in the top plate and a second frontside nozzle positioned between a center of the top plate and the edge of the semiconductor wafer.

In some embodiments, the upper working surface and the lower working surface are substantially flat, planar surfaces. In other embodiments, the upper working surface and the lower working surface are non-planar surfaces. The non-planar surfaces may be configured to provide a more uniform fluid velocity of the processing fluid radially across the top surface and the bottom surface of the semiconductor wafer compared to substantially flat, planar surfaces.

In some embodiments, the upper working surface and the lower working surface each comprise a non-wetting coating layer, which provides a substantially 90 degree contact angle between the processing fluid and the upper working surface and the lower working surface. In some embodiments, the non-wetting coating layer may be used along with the drainage system to provide uniform drying of the semiconductor wafer surface(s).

In some embodiments, additional features may be added to the top plate and/or the bottom plate of the chamber. For example, a sonic transducer, a heating element or a sensor may be coupled to, or embedded within, the top plate and/or the bottom plate of the chamber.

The chamber may further include an upper gap between the upper working surface and the top surface of the semiconductor wafer, and a lower gap between the lower working surface and the bottom surface of the semiconductor wafer. The upper gap and the lower gap may generally range between about 0.01 mm and about 10.0 mm. In some embodiments, the processing system described herein may further include at least one lifting mechanism and a controller. The at least one lifting mechanism may be coupled to at least one of the top plate and the bottom plate for adjusting a vertical position of the at least one of the top plate and the bottom plate. The controller may be coupled to the at least one lifting mechanism to adjust the vertical position of the at least one of the top plate and the bottom plate and change at least one of the upper gap and the lower gap.

As noted above, the drainage system contains a conduit downstream from the processing space for directing the processing fluid out of the processing space. In some embodiments, the conduit may include a first portion that is coupled to the processing space and positioned below the lower working surface. The first portion of the conduit may be a U-shaped conduit, which is configured to temporarily trap or retain the portion of the processing fluid to provide the pressure resistance against the processing fluid directed into the processing space.

In some embodiments the conduit may further include a second portion positioned above the lower working surface and a third portion positioned below the lower working surface. The second portion of the conduit is coupled between the first portion of the conduit and the third portion of the conduit. The third portion of the conduit is coupled to the first portion of the conduit, the second portion of the conduit and an outlet of the drainage system.

In some embodiments, the conduit may further include a first valve positioned between the first portion of the conduit and the second portion of the conduit, and a second valve positioned between the first portion of the conduit and the third portion of the conduit. When the first valve is open and the second valve is closed, the conduit is configured to direct the processing fluid out of the processing space and sequentially through the first portion, the second portion and the third portion of the conduit to the outlet of the drainage system. In other words, the second portion of the conduit is configured to increase the pressure resistance against the processing fluid directed into the processing space when the first valve is open and the second valve is closed. On the other hand, when the first valve is closed and the second valve is open, the conduit is configured to direct the processing fluid out of the processing space and sequentially through the first portion and the third portion of the conduit to the outlet of the drainage system.

According to another embodiment, a method is provided herein for processing a semiconductor wafer. In some embodiments, the method may include inserting the semiconductor wafer into a processing space between a bottom plate having portions defining a lower working surface and a top plate having portions defining an upper working surface of an enclosed chamber, and supporting the semiconductor wafer substantially parallel to the upper and lower working surfaces. The method may further include processing at least one surface of the semiconductor wafer by: (a) injecting at least one processing fluid into the processing space through at least one opening in either the top plate, the bottom plate, or both the top plate and the bottom plate; (b) forcing the at least one processing fluid over at least one surface of the semiconductor wafer; and (c) directing the at least one processing fluid from the processing space through a drainage system having a conduit downstream from the processing space, wherein said directing retains a portion of the at least one processing fluid within the conduit to provide a pressure resistance against the at least one processing fluid injected into the processing space.

In some embodiments, said injecting the at least one processing fluid may include injecting a liquid into the processing space to process the at least one surface of the semiconductor wafer. In such embodiments, said directing may retain a portion of the liquid within the conduit to provide a pressure resistance against the liquid injected into the processing space. In doing so, the pressure resistance may provide a uniform fluid velocity of the liquid radially across the at least one surface of the semiconductor wafer.

In some embodiments, the method may include one or more additional steps before injecting the liquid into the processing space. For example, the method may further include injecting a low surface tension liquid into the processing space to pre-wet the at least one surface of the semiconductor wafer, the upper working surface and the lower working surface. The low surface tension liquid injected into the processing space prevents air bubble formation on the at least one surface of the semiconductor wafer when the liquid is subsequently injected into the processing space.

In some embodiments, said injecting the at least one processing fluid may further include injecting a gas into the processing space, after injecting the liquid, to dry the at least one surface of the semiconductor wafer. In such embodiments, said directing may retain a portion of the liquid within the conduit to provide a pressure resistance against the gas injected into the processing space. In doing so, the pressure resistance may provide uniform drying of the at least one surface of the semiconductor wafer.

In some embodiments, the method may include one or more additional steps after said injecting the liquid into the processing space. For example, the method may further include: (a) injecting a rinse solution into the processing space to remove the liquid and rinse the at least one surface of the semiconductor wafer; (b) injecting a low surface tension liquid into the processing space to remove the rinse solution from the at least one surface of the semiconductor wafer; and (c) and treating the at least one surface of the semiconductor wafer with a supercritical fluid. In some embodiments, the method may further include adjusting a vertical position of the top plate and the bottom plate to reduce a gap between the top plate and the bottom plate and decrease an amount of the low surface tension liquid on the at least one surface of the semiconductor wafer before treating the at least one surface of the semiconductor wafer with the supercritical fluid.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIG. 6 is a flowchart diagram illustrating one embodiment of a method for processing a semiconductor wafer in accordance with the present disclosure;

DETAILED DESCRIPTION

The present disclosure provides improved processing systems and methods for wet and dry processing of a semiconductor wafer. The processing systems and methods disclosed herein provide various advantages over conventional systems and methods for processing a semiconductor wafer. For example, the disclosed processing systems and methods provide an enclosed chamber for wet and dry processing of a semiconductor wafer. The enclosed chamber includes a top plate and a bottom plate, which physically confine the processing fluid(s) within a relatively small, enclosed processing space (PS). This forces the processing fluid(s) to flow radially across the wafer surface(s) without the need to rotate the wafer and results in a more compact chamber design. The top and bottom plates of the enclosed chamber also: (a) reduce the amount of processing fluid(s) needed to perform a process, (b) isolate the wafer from the environment, and (c) enable additional features and functionality (e.g., a sonic transducer, heating element, additional nozzle and/or sensor) to be utilized.

In addition to an enclosed chamber, the disclosed processing systems and methods provide a drainage system that improves wet and dry processing of a semiconductor wafer. The drainage system contains a conduit, which is positioned downstream from the processing space and configured to temporarily trap or retain at least a portion of a processing fluid dispensed within the processing space and directed through the conduit. The portion of the processing fluid retained within the conduit provides a pressure resistance against the processing fluid(s) dispensed within the processing space. This pressure resistance improves wet processing by providing a more uniform fluid flow velocity of the processing fluid as it spreads radially across the wafer surface. During dry processing, the pressure resistance provided by the processing fluid trapped within the conduit provides a more uniform radial removal of the processing fluid from the wafer surface.

Figure 1A:
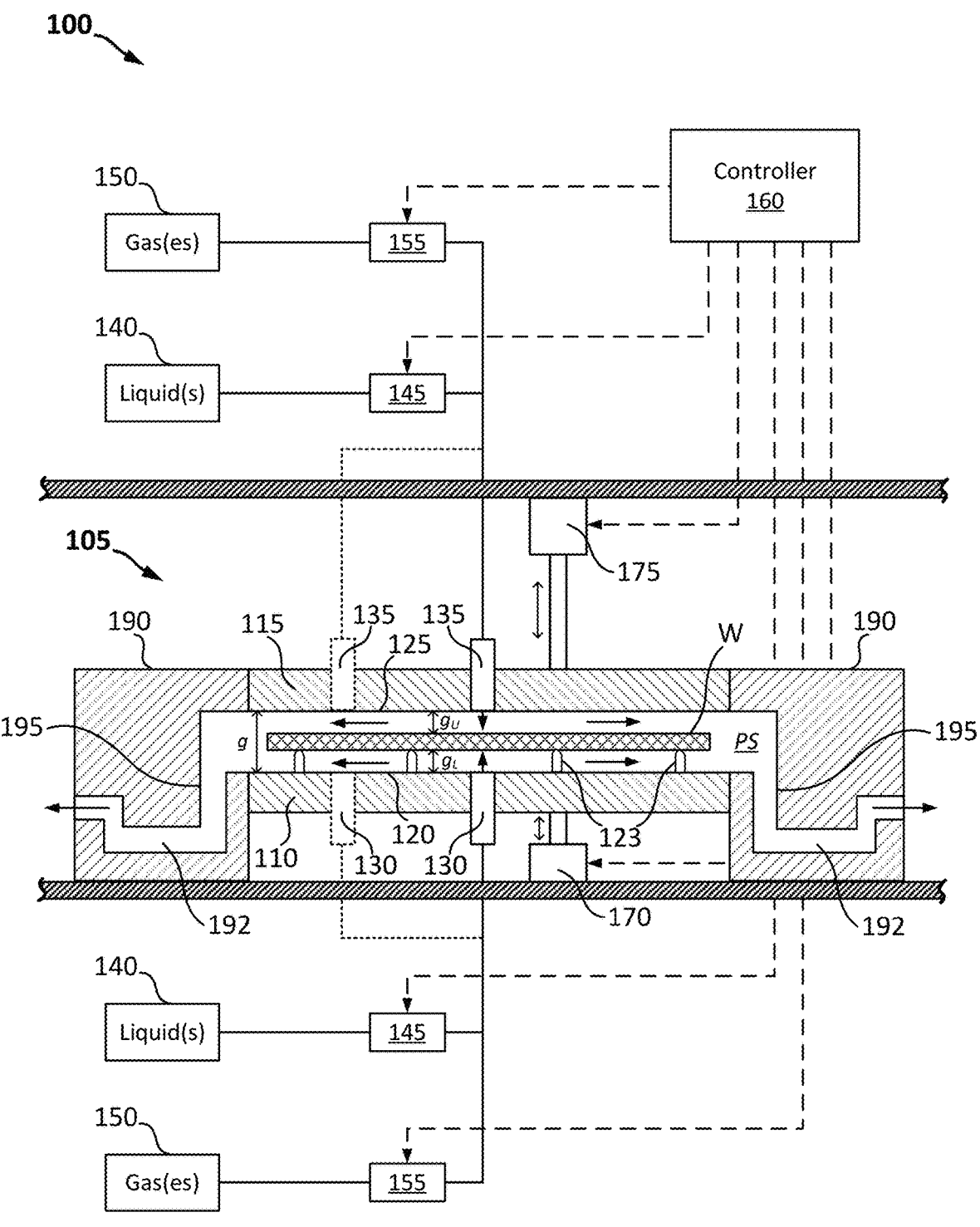
FIG. 1A is a cross-sectional view illustrating one embodiment of a processing system for wet and dry processing of a semiconductor wafer in accordance with the present disclosure.

FIG. 1A schematically shows a single wafer processing system 100 for wet and dry processing of a semiconductor wafer according to one embodiment of the present disclosure. The processing system 100 shown in FIG. 1A includes a chamber 105 in which a semiconductor wafer (W) is processed. The chamber 105 includes a bottom plate 110 having portions defining a lower working surface 120 inside the chamber 105, and a top plate 115 having portions defining an upper working surface 125 inside the chamber 105. The upper working surface 125 inside the chamber 105 is spaced above the lower working surface 120 and separated by a gap (g). A processing space (PS) is formed between the upper working surface 125 and the lower working surface 120 of the chamber 105.

The chamber 105 further includes means for supporting the semiconductor wafer (W) in the processing space (PS). In some embodiments, the means for supporting the wafer can include a plurality of pins 123 that extend through the bottom plate 110 into the processing space and support the wafer from the bottom, as shown in FIG. 1A. In one example, the wafer may be supported by at least three circumferentially spaced pins 123 projecting from the bottom plate 110 and extending above the lower working surface 120. In other embodiments, a plurality of pins 123 can support the wafer by contacting the edge of the wafer, as shown in FIG. 1D. Although either embodiment may be utilized, a plurality of pins 123 that support the wafer from the bottom may prevent sagging of the wafer, and thus, the formation of a non-uniform gap between the upper/lower working surfaces of the chamber 105 and the top/bottom surfaces of the wafer.

When a semiconductor wafer (W) to be processed is inserted and mounted within the processing space (PS), an upper gap ($g_U$) is present between the upper working surface 125 of the chamber 105 and the top surface of the wafer, and a lower gap ($g_L$) is present between the lower working surface 120 of the chamber 105 and the bottom surface of the wafer. It is generally desired that the upper gap ($g_U$) and the lower gap ($g_L$) be substantially equal to maintain a similar distance (or uniform gap) between the upper working surface 125 and the top surface of the wafer (W) and the lower working surface 120 and the bottom surface of the wafer (W). The upper gap ($g_U$) and the lower gap (gr) may range between about 0.01 mm and about 10.0 mm.

Figure 1B:
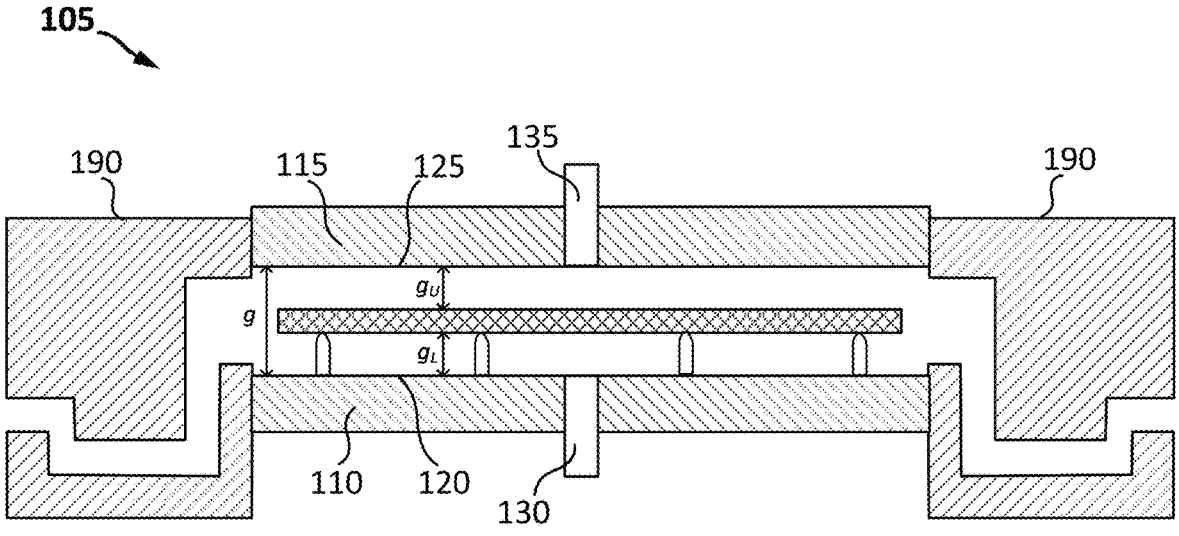
FIG. 1B is cross-sectional view through a portion of the chamber shown in FIG. 1A, illustrating an adjustment of the top and bottom plates to increase a gap (g) between the top and bottom plates.
Figure 1C:
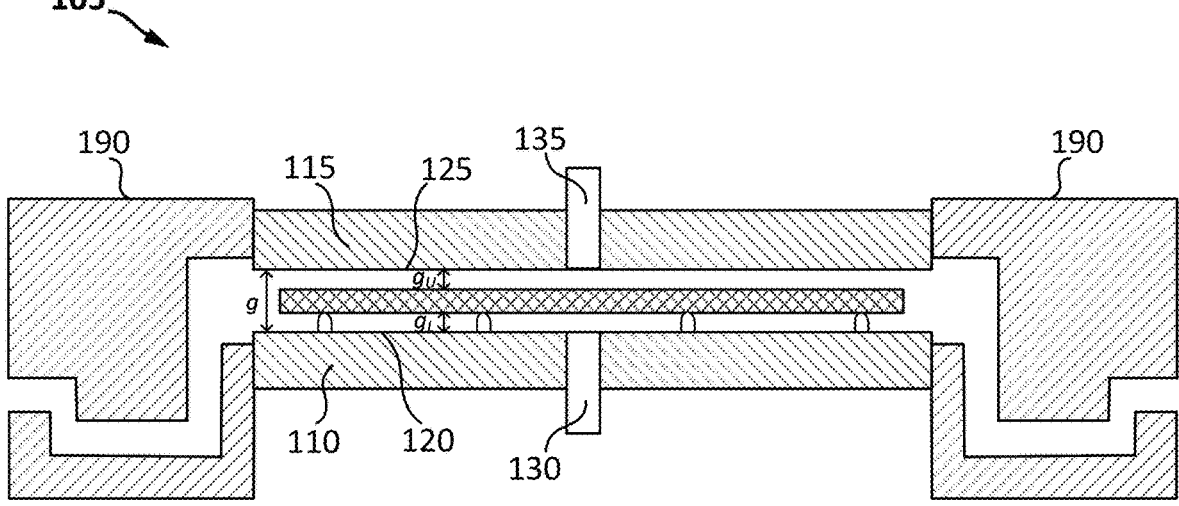
FIG. 1C is cross-sectional view through a portion of the chamber shown in FIG. 1A, illustrating an adjustment of the top and bottom plates to decrease a gap (g) between the top and bottom plates.
Figure 1D:
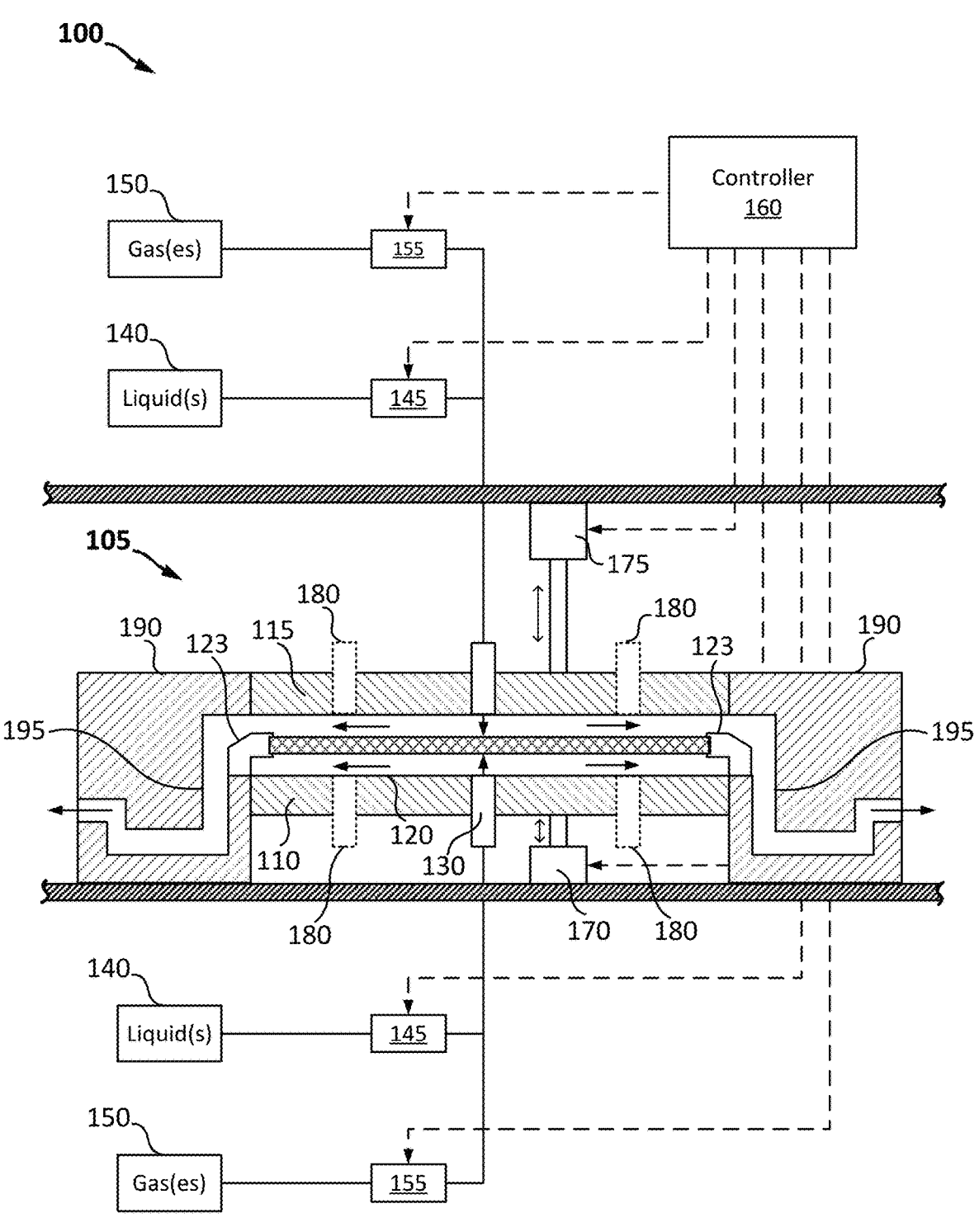
FIG. 1D is a cross-sectional view illustrating another embodiment of a processing system for wet and dry processing of a semiconductor wafer in accordance with the present disclosure.

In some embodiments, the upper gap ($g_U$) and the lower gap ($g_L$) can be adjusted before or during a process to increase the gap (g) between the upper working surface 125 and the lower working surface 120, and thus, increase the interior volume of the processing space (PS), as shown in FIG. 1B. In other embodiments, the upper gap ($g_U$) and the lower gap ($g_L$) can be adjusted before or during a process to decrease the gap (g) between the upper working surface 125 and the lower working surface 120, and thus, decrease the interior volume of the processing space (PS), as shown in FIG. 1C.

As shown in FIG. 1A, the bottom plate 110 may have at least one opening 130 that passes through the lower working surface 120 of the chamber 105. When processing a semiconductor wafer (W) mounted within the processing space (PS), the at least one opening 130 passing through the lower working surface 120 may be in fluid flow communication with at least one processing fluid (e.g., a liquid and/or a gas), and may be configured to direct the at least one processing fluid into the processing space (PS) above the lower working surface 120 for processing a bottom surface of the semiconductor wafer (W).

In some embodiments, the at least one opening 130 passing through the lower working surface 120 may include one or more backside nozzles for dispensing a processing fluid into the processing space (PS) above the lower working surface 120. In one embodiment, the at least one opening 130 can include a backside nozzle, which is centered in the bottom plate 110 for dispensing the processing fluid into the processing space (PS) near a center of the semiconductor wafer (W), as shown in FIG. 1A. In some embodiments, the at least one opening 130 can optionally include one or more auxiliary backside nozzles, which are positioned between the center of the bottom plate 110 and the edge of the wafer for dispensing the processing fluid (or a different processing fluid) onto other areas of the wafer. Regardless of the number of backside nozzles utilized, the processing fluid(s) dispensed from the backside nozzle(s) is/are directed onto the bottom surface of the semiconductor wafer (W) and thereafter flow radially towards the edge of the wafer. According to one embodiment, the backside nozzle(s) may be coupled to a controller (such as controller 160) configured for selecting a first processing fluid (e.g., a liquid or a gas) that is introduced into the processing space.

The top plate 115 may also have at least one opening 135 that passes through the upper working surface 125 of the chamber 105. When processing a semiconductor wafer (W) mounted within the processing space (PS), the at least one opening 135 passing through the upper working surface 125 may be in fluid flow communication with at least one processing fluid (e.g., a liquid and/or a gas), and may be configured to direct the at least one processing fluid into the processing space (PS) below the upper working surface 125 for processing a top surface of the semiconductor wafer (W).

In some embodiments, the at least one opening 135 passing through the upper working surface 125 may include one or more frontside nozzles for dispensing the processing fluid into the processing space (PS) below the upper working surface 125. In one embodiment, the at least one opening 135 can include a frontside nozzle, which is centered in the top plate 115 for dispensing the processing fluid into the processing space (PS) near a center of the semiconductor wafer (W), as shown in FIG. 1A. The at least one opening 135 can optionally include one or more auxiliary frontside nozzles, which are positioned between the center of the top plate 115 and the edge of the wafer for dispensing the processing fluid (or a different processing fluid) onto other areas of the wafer. Regardless of the number of frontside nozzles utilized, the processing fluid(s) dispensed from the frontside nozzle(s) is/are directed onto the top surface of the semiconductor wafer (W) and thereafter flow radially towards the edge of the wafer. Similar to the backside nozzle(s), the frontside nozzle(s) may be coupled to a controller (such as controller 160) that is configured for selecting a second processing fluid (e.g., a liquid or a gas) that is introduced into the processing space.

According to one embodiment, the processing system 100 shown in FIG. 1A may be configured for wet processing a semiconductor wafer (W) in the processing space (PS). The wet processing can include introducing a first liquid into the processing space through the at least one opening 130 in the lower working surface 120, introducing a second liquid into the processing space through the at least one opening 135 in the upper working surface 125, or both. The first liquid and the second liquid may be the same liquid, or may be different liquids. In one example, the wet processing is a cleaning process where a top surface of the wafer, a bottom surface of the wafer, or both, are cleaned of residues and contaminants.

According to one embodiment, the processing system 100 shown in FIG. 1A may be configured for dry processing a semiconductor wafer (W) in the processing space (PS). The dry processing can include introducing a first gas into the processing space through the at least one opening 130 in the lower working surface 120, introducing a second gas into the processing space through the at least one opening 135 in the upper working surface 125, or both. The first gas and the second gas may be the same gas, or may be different gases. In one example, the dry processing is a drying process where a top surface of the wafer, a bottom surface of the wafer, or both, are dried of liquids.

According to one embodiment, the processing system 100 shown in FIG. 1A may be configured for wet processing, followed by dry processing, of a semiconductor wafer (W) in the processing space (PS). In one example, the wet processing may be a cleaning process where a top surface of the wafer, a bottom surface of the wafer, or both, are cleaned of residues and contaminants by injecting one or more liquids onto the wafer surface(s). The dry processing may be a drying process where a top surface of the wafer, a bottom surface of the wafer, or both, are dried by injecting one or more gases onto the wafer surface(s) to remove a liquid from the wafer surface(s).

According to one embodiment, the semiconductor wafer (W) is not rotated during wet or dry processing. According to another embodiment, the processing system 100 comprises means for rotating the wafer (not shown) and the wafer is rotated during wet processing, dry processing or both wet and dry processing.

In some embodiments, the at least one opening 130 passing through the upper working surface 125 of the chamber 105 and the at least one opening 135 passing through the lower working surface 120 of the chamber 105 may be in fluid flow communication with one or more liquids 140 and/or one or more gases 150 via one or more supply lines and valves 145/155, as shown further in FIG. 1A. In some embodiments, the processing system 100 may include a controller 160 that is coupled to the liquid and gas supply valves 145/155 for selectively providing the one or more liquids 140 and/or the one or more gases 150 to the processing space (PS) defined within the chamber 105. A wide variety of liquids and gases may be selectively provided to the processing space (PS) depending on the process, or process step, being performed within the chamber 105.

During a cleaning process, for example, the controller 160 may supply control signals to the liquid and gas supply valves 145/155 to selectively provide a cleaning solution and/or a rinse solution to the processing space (PS) for cleaning and/or rinsing at least one surface of the semiconductor wafer (W). Examples of cleaning solutions include, but are not limited to, an ammonia/peroxide mixture (APM), a hydrochloric/peroxide mixture (HPM) and a sulfuric peroxide mixture (SPM). Examples of rinse solutions include, but are not limited to, deionized (DI) water and isopropyl alcohol (IPA). Other cleaning solutions and rinse solutions may also be utilized. After cleaning and/or rinsing the wafer surface(s), the controller 160 may supply control signals to the liquid and gas supply valves 145/155 to selectively provide a gas (such as, but not limited to, air or nitrogen) to the processing space (PS) to remove any remaining liquid the wafer surface(s), thereby drying the wafer surface(s).

In some embodiments, the controller 160 may supply control signals to the liquid and gas supply valves 145/155 to selectively provide a low surface tension liquid (such as IPA) to the processing space (PS), before the cleaning step is performed, to pre-wet the wafer surface, as well as the upper working surface 125 and the lower working surface 120 of the chamber 105. As described in more detail below, pre-wetting may be utilized in some embodiments to improve fluid flow across the wafer surface(s) and prevent air bubble formation on the wafer surface(s) when a liquid (e.g., a cleaning solution) is subsequently dispensed into the processing space.

In some embodiments, the controller 160 (or another controller included within the processing system 100) may be configured to adjust a vertical position of the top plate 115, a vertical position of the bottom plate 110 and/or the gap (g) between the top and bottom plates. In the embodiment shown in FIG. 1A, controller 160 is coupled to supply control signals to a lifting mechanism 170 coupled to the bottom plate 110 and a lifting mechanism 175 coupled to the top plate 115. The placement and configuration of the lifting mechanisms 170/175 is exemplary and provided herein merely for explanatory purposes.

The control signals supplied from the controller 160 to the lifting mechanisms 170/175 can be used to adjust a vertical position of the top plate 115 and/or a vertical position of the bottom plate 110. In some embodiments, for example, the controller 160 may supply a control signal to the lifting mechanism 175 to raise the top plate 115, so that a semiconductor wafer (w) may be inserted with the processing space (PS), as shown for example in FIG. 7A. In other embodiments, the controller 160 may supply control signals to the lifting mechanisms 170/175 to adjust the upper gap $(g_U)$ between the upper working surface 125 of the chamber 105 and the top surface of the wafer (W) and/or to adjust the lower gap $(g_L)$ between the lower working surface 120 of the chamber 105 and the bottom surface of the wafer (W), as shown for example in FIGS. 1B and 1C. It is recognized that the controller 160 and the lifting mechanisms 170/175 represent only one means for adjusting the vertical position of the top plate 115, the vertical position of the bottom plate 110 and/or the gap (g) between the top and bottom plates. Other means for adjustment may also be used.

The upper gap $(g_U)$ and the lower gap $(g_L)$ can be adjusted for a wide variety of purposes. In some embodiments, the upper gap $(g_U)$ and the lower gap $(g_L)$ can be decreased, as shown in FIG. 1C, to decrease the interior volume of the processing space (PS), increase the fluid velocity of the processing fluid(s) spreading radially across the wafer surface(s) and/or decrease the amount of processing fluid(s) needed to perform a particular process or process step. On the other hand, the upper gap $(g_U)$ and the lower gap $(g_L)$ can be increased, as shown in FIG. 1B, to increase the interior volume of the processing space (PS), decrease the fluid velocity of the processing fluid(s) spreading radially across the wafer surface(s) and/or increase the amount of processing fluid(s) needed to perform a particular process or process step. In some embodiments, the upper gap ($g_U$) and the lower gap ($g_L$) can be adjusted together, or independently, for different processes (e.g., different cleaning processes), or different steps (e.g., cleaning and rinse steps) within the same process.

In some embodiments, additional feature(s) 180 may be added to the top plate 115 and/or the bottom plate 110 of the chamber 105. For example, a sonic transducer may be added to the top plate 115 and/or the bottom plate 110 to enhance the wet (e.g., cleaning) process. The sonic transducer can be embedded within the entire top/bottom plate, or within only a portion of the top/bottom plate. In another example, the top plate 115 and/or the bottom plate 110 may include a heating element to heat the liquid/gas dispensed onto the wafer surface. Alternatively, an additional nozzle may be embedded within the top plate 115 and/or the bottom plate 110 to inject steam into the processing space to heat the liquid/gas dispensed onto the wafer surface. In yet another example, the top plate 115 and/or the bottom plate 110 may include one or more sensors used to inspect the wafer and/or the liquids dispensed onto the wafer surface(s). For example, a conductive meter may be added to the top/bottom plate to monitor the liquids dispensed onto the wafer surface.

FIG. 1D illustrates an alternative embodiment of a processing system 100 in which additional feature(s) 180 is/are coupled to the top plate 115 and/or the bottom plate 110 of the chamber 105. The additional feature(s) 180 (e.g., a sonic transducer, heating element, additional nozzle and/or sensor) may be provided anywhere within the top plate 115 and/or the bottom plate 110 and is/are not limited to the example placement shown in FIG. 1D.

The processing system 100 shown in FIGS. 1A-1D provides several advantages over conventional process chambers used for wet/dry processing of a semiconductor wafer. Unlike conventional spin chambers, for example, the top plate 115 and the bottom plate 110 respectively define an upper working surface 125 and a lower working surface 120 of an enclosed chamber 105. During wet/dry processing, the top plate 115 and the bottom plate 110 physically confine the processing fluid(s) used to process a semiconductor wafer (W) within a relatively small, enclosed processing space (PS). This provides several advantages, which are not achieved in conventional spin chambers.

For example, the top plate 115 and the bottom plate 110 reduce the amount of processing fluid(s) needed to perform a particular process or process step (compared to conventional process chambers that do not utilize top and bottom plates) by physically confining the processing fluid(s) dispensed onto the wafer surface(s) and preventing the dispensed processing fluid(s) from escaping. As described in more detail below with respect to FIGS. 7C and 7D, the processing fluid(s) dispensed onto the wafer surface(s) fill the enclosed processing space (PS) defined between the upper working surface 125 and the lower working surface 120 of the chamber 105. This provides additional fluid savings during a puddle process by eliminating the need to dispense additional fluids onto the wafer surface. In addition to fluid savings, the top plate 115 and the bottom plate 110 isolate the wafer from the environment, and thus, minimize the impact on the wafer from the environment (such as, e.g., oxygen or defects from exposure to ambient air, liquid splash back from a drain cup, etc.).

The relatively small, enclosed processing space (PS) defined between the upper working surface 125 and the lower working surface 120 of the chamber 105 forces the processing fluid(s) to flow radially across the wafer surface(s) without the need to rotate the wafer. This results in a more compact chamber design, compared to conventional spin chambers, by eliminating the need for a spin chuck and motor.

In some embodiments, the upper working surface 125 and the lower working surface 120 of the chamber 105 may be substantially flat, planar surfaces, as shown in FIGS. 1A-1D. When implemented with substantially flat, planar working surfaces, the upper gap ($g_U$) and lower gap ($g_L$) may be substantially equal across the wafer surfaces.

In other embodiments, the upper working surface 125 and the lower working surface 120 of the chamber 105 may not be substantially flat, but rather may be implemented with a wide variety of non-planar surfaces. Non-planar working surfaces may be utilized, in some embodiments, to provide a more uniform fluid velocity of the processing fluid(s) radially across the wafer surface(s). Examples of non-planar working surfaces are shown schematically in FIGS. 2A-2D.

Figure 2A:
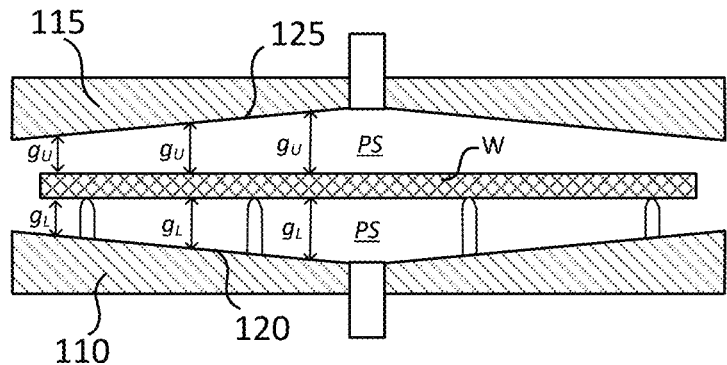
FIGS. 2A-2C are cross-sectional views through a portion of the chamber shown in FIG. 1A, illustrating the top and bottom plates having non-planar working surfaces.
Figure 2B:
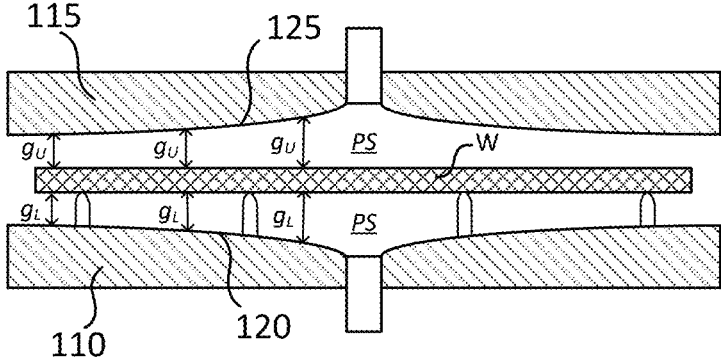

In some embodiments, the upper working surface 125 and the lower working surface 120 of the chamber 105 may have an inverted V shape, as shown in FIG. 2A. The inverted V shape may provide a uniform fluid velocity of the processing fluid(s) radially across the top and bottom surfaces of the semiconductor wafer (W) by steadily decreasing the upper gap ($g_U$) and the lower gap ($g_L$) in the radial direction, from the center of the wafer to the wafer edge. A similar effect may be achieved by providing the upper working surface 125 and the lower working surface 120 of the chamber 105 with a curved surface, as shown for example in FIG. 2B. Like the inverted V shape, the curved surface shown in FIG. 2B gradually decreases the upper gap ($g_U$) and the lower gap ($g_L$) in the radial direction, from the center of the wafer to the wafer edge.

Figure 2C:
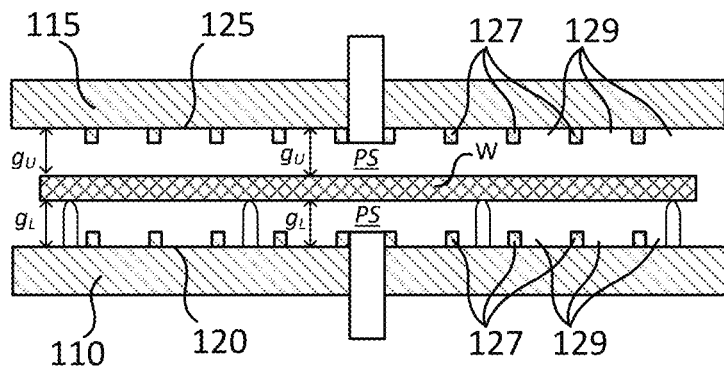
Figure 2D:
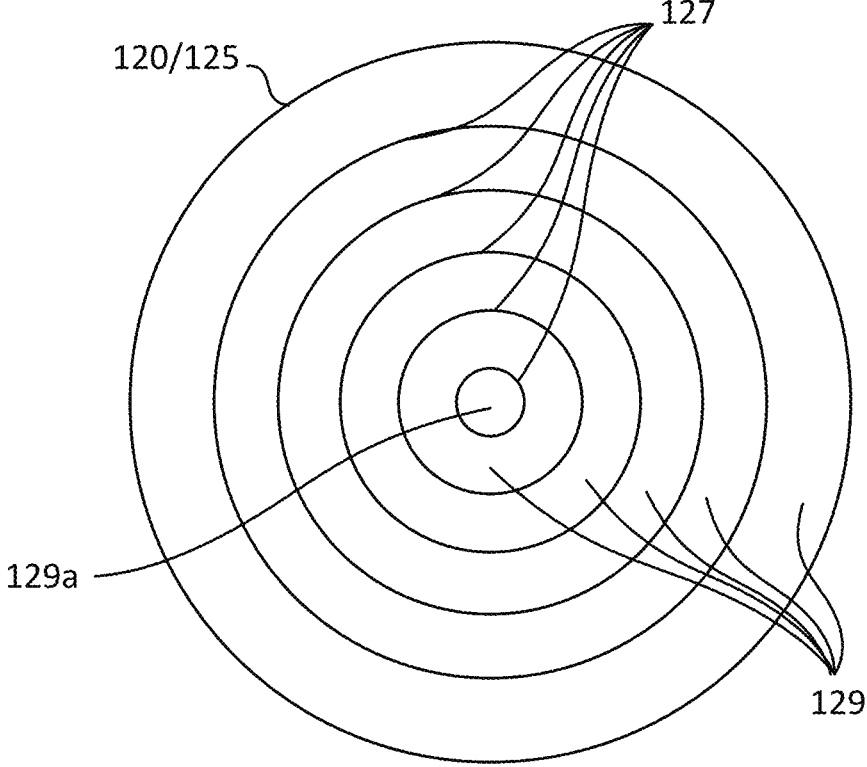
FIG. 2D is a front view of a working surface having a plurality of ribs and a plurality of recesses.

In other embodiments, the upper working surface 125 and the lower working surface 120 of the chamber 105 may be ribbed or grooved. For example, the upper working surface 125 and the lower working surface 120 may each be implemented with a plurality of radial ribs 127 that extend from the working surfaces, as shown in FIG. 2C. As shown in FIG. 2D, the plurality of ribs 127 are formed concentrically around a center axis of the upper working surface 125 and the lower working surface 120. A plurality of recesses 129 are formed between the plurality of ribs 127, with each recess 129 formed between two adjacent ribs 127. Although five ribs are illustrated in the example shown in FIGS. 2C-2D for explanatory purposes, the upper working surface 125 and the lower working surface 120 of the chamber 105 may include a greater or lesser number of ribs.

The plurality of radial ribs 127 and recesses 129 shown in FIGS. 2C-2D may be utilized, in some embodiments, to provide a uniform fluid velocity of the processing fluid(s) radially across the top and bottom surfaces of the semiconductor wafer (W) by acting as fluid buffers. When a processing fluid (e.g., a cleaning solution, a rinse solution or another liquid) is dispensed into the processing space (PS) and onto the wafer surface(s), the dispensed fluid may fill the innermost recess 129a first before spreading radially outward across the wafer surface(s) to each adjacent recess 129. In this manner, the processing fluid spreads radially across the wafer surface(s) in stages, with substantially equal fluid velocity within each stage.

The processing system 100 shown in FIGS. 1A-1D further includes a drainage system 190 for directing processing fluids out of the chamber 105. According to one embodiment, drainage system 190 contains a conduit 195 that is in fluid communication with, and downstream from, the processing space (PS). The conduit 195 is generally configured to temporarily trap or retain at least a portion of the processing fluid(s) dispensed within the processing space during wet/dry processing. The portion of the processing fluid(s) retained within the conduit 195 provides a pressure resistance against the processing fluid(s) dispensed within the processing space during wet and dry processing steps.

During wet processing, for example, a liquid may be dispensed within the processing space above and/or below the semiconductor wafer (W) for processing a top surface and/or a bottom surface of the wafer. The liquid spreads radially across the wafer surface(s) and spills over into the conduit 195. The conduit 195 includes a first portion 192, which is coupled to the processing space (PS) and positioned below the lower working surface 120 of the chamber 105. At least a portion of the liquid may be at least temporarily retained within the first portion 192 of the conduit 195. The retained portion of the liquid provides a pressure resistance against the processing fluids dispensed within the processing space.

According to one embodiment, the first portion 192 of the conduit 195 is implemented with a U-shape, as shown in FIGS. 1A-1D. A bottom of the U-shaped conduit is positioned below the lower working surface 120 of the chamber 105. This positioning, along with the shape of the conduit, enables the U-shaped conduit to temporarily trap or retain a portion of the liquid that spills over from the processing space. The liquid temporarily trapped within the U-shaped conduit separates an atmosphere in the processing space from an atmosphere downstream from the U-shaped conduit. Any additional liquid entering the U-shaped conduit from the processing space will replace the liquid already in the U-shaped conduit.

The inventors realized that the U-shaped conduit in the drainage system 190 provides many advantages over other conduit designs. One of the advantages results from the fact that the U-shaped conduit traps a liquid from the processing space to seal an atmosphere in the processing space from an atmosphere downstream from the U-shaped conduit. This provides advantages in both wet and dry processing.

During wet processing, the liquid in the U-shaped conduit of the drainage system 190 provides a pressure resistance against the liquid introduced into the processing space above and/or below the wafer. The pressure resistance enables the liquid dispended within the processing space to completely fill the processing space and results in a smooth and uniform flow of the liquid across the wafer surface(s), from the center of the wafer to the edge of the wafer. The uniform fluid flow of the liquid across the wafer surface(s) results in more efficient and uniform processing of the wafer.

Similarly, during dry processing, the liquid in the U-shaped conduit of the drainage system 190 provides a pressure resistance against the gas introduced into the processing space above and/or below the wafer. The pressure resistance provided by the liquid retained within the U-shaped conduit increases the gas pressure within the processing space and results in smooth and uniform flow of the gas across the wafer surface(s), from the center of the wafer to the edge of the wafer.

Figure 3A:
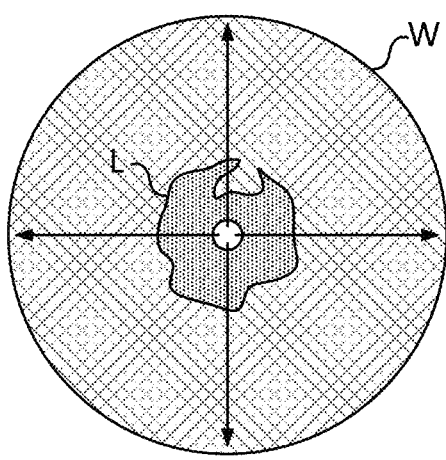
FIGS. 3A and 3B illustrate problems that occur when a processing fluid is injected onto a wafer surface in a conventional processing system that does not utilize the techniques described herein.
Figure 3B:
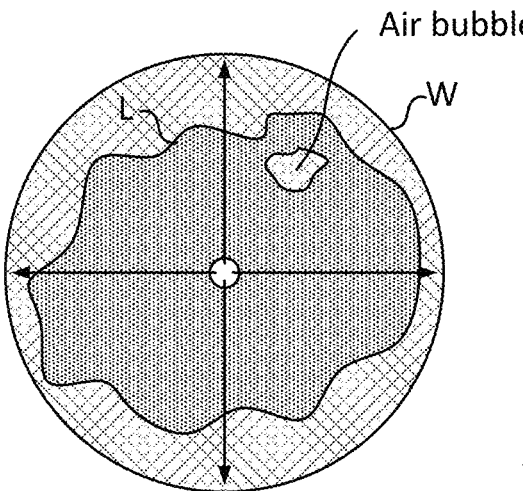

FIGS. 3A and 3B illustrate problems that occur during wet processing in a conventional processing system that does not include the drainage system 190 shown and described herein. When liquid (L) is dispensed onto a surface of a semiconductor wafer (W) from a central opening or nozzle, the liquid spreads radially across the wafer surface, from the center of the wafer to the wafer edge. Without the pressure resistance provided by the drainage system 190, however, the liquid may spread radially across the wafer surface with a non-uniform fluid flow velocity, as shown in FIG. 3A. In some cases, the non-uniform fluid flow velocity may result in air bubble formation on the wafer surface, as shown in FIG. 3B.

Figure 3C:
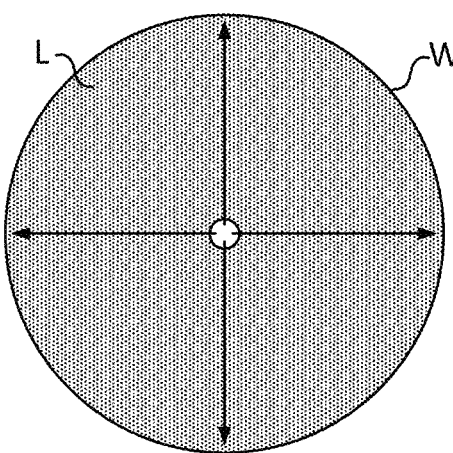
FIG. 3C illustrates improved wetting of the wafer surface using the techniques described herein.

FIG. 3C illustrates improved wetting of the wafer surface using the techniques described herein. The pressure resistance provided by the liquid temporarily trapped or retained within the U-shaped conduit of the drainage system 190 enables the liquid to spread radially across the wafer surface with a uniform fluid flow velocity. In some embodiments, the fluid flow velocity of the liquid may be further improved by providing the chamber 105 with non-planar upper/lower working surfaces, as shown for example in FIGS. 2A-2D. In other embodiments, uniform fluid flow velocity of the liquid may be improved by pre-wetting the wafer surfaces and the upper/lower working surfaces of the chamber 105 with a low surface tension liquid (such as IPA), as described in more detail below. Non-planar working surfaces, pre-wetting and/or both may be utilized along with the drainage system 190 to improve wetting of the wafer surface and provide uniform fluid flow velocity of a liquid across the wafer surface.

In one example, after wet processing, a thin liquid film is present on surfaces of the wafer. During dry processing, the thin liquid film needs to be uniformly removed from the center of the wafer to the edge of the wafer. However, problems often occur during dry processing when a gas is injected onto a wafer surface in a conventional processing system that does not include the drainage system 190 shown and described herein.

Figure 4A:
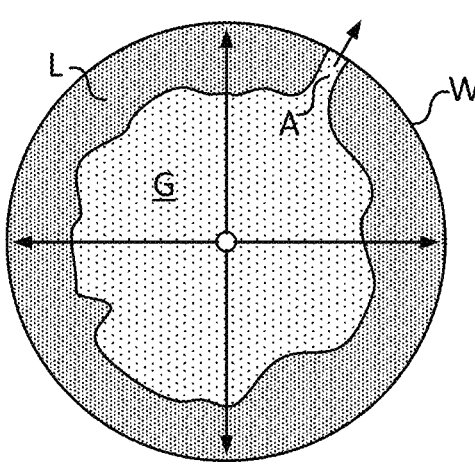
FIGS. 4A-4B illustrate problems that occur when a gas is injected onto a wafer surface to remove a processing liquid from the wafer surface in a conventional processing system that does not utilize the techniques described herein.

FIG. 4A illustrates one problem that occurs when a gas (G) is injected onto a surface of a semiconductor wafer (W) to remove a processing liquid (L) from the wafer surface in a conventional processing system that does not include the drainage system 190. Without the pressure resistance provided by the drainage system 190, non-uniform removal of the thin liquid film of the liquid (L) is observed, resulting in complete radial removal of the thin liquid film in some areas, but not in other areas. This is shown schematically in FIG. 4A. Once the gas (e.g., air or nitrogen, $N_2$) is able to completely remove the thin liquid film radially in one area (e.g., area A), the gas escapes and stops pushing the thin liquid film in other areas, resulting in non-uniform drying of the wafer surface.

Figure 4B:
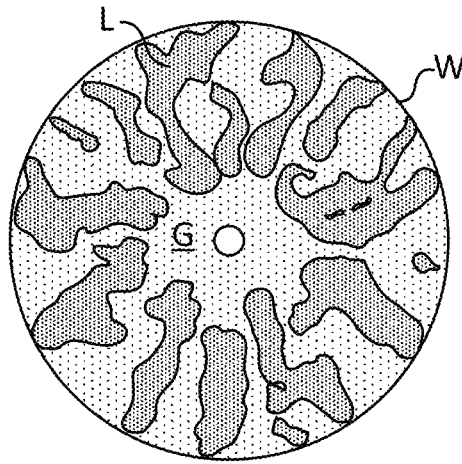

FIG. 4B illustrates another problem that occurs when a gas (G) is injected onto a surface of a semiconductor wafer (W) to remove a processing liquid (L) from the wafer surface in a processing system that does not include the drainage system 190. When a liquid contacts a surface, the liquid may spread out along the surface (i.e., wet the surface) or form a bead on the surface, depending on properties of the liquid and the surface. The angle at which the liquid contacts the surface is referred to as the "contact angle." The contact angle is a measure of the ability of a liquid to spread out along or "wet" a surface of a solid. When the contact angle is less than 90°, the low surface tension between the liquid and the surface enables the liquid to spread out across the surface. When this occurs, the surface is described as being hydrophilic (in the case of water) or having good wettability. When the contact angle is greater than 90°, the higher surface tension between the liquid and the surface causes the liquid to bead up on the surface. When this occurs, the surface is described as being hydrophobic (in the case of water) or non-wetting.

Problems may occur during dry processing when a contact angle substantially greater than 90° or substantially less than 90° exists between the processing liquid (L) and the upper and/or lower working surfaces of the chamber. For example, the inventors recognized that when a gas (G) was injected into the chamber to remove a processing liquid (L) from the wafer surface, non-uniform drying occurred when the contact angle between the processing liquid (L) and the upper and/or lower working surfaces of the processing chamber was substantially less than or greater than 90°. Specifically, fingering of the processing liquid (L) was observed with a contact angle substantially less than 90°, as shown in FIG. 4B.

Figure 4C:
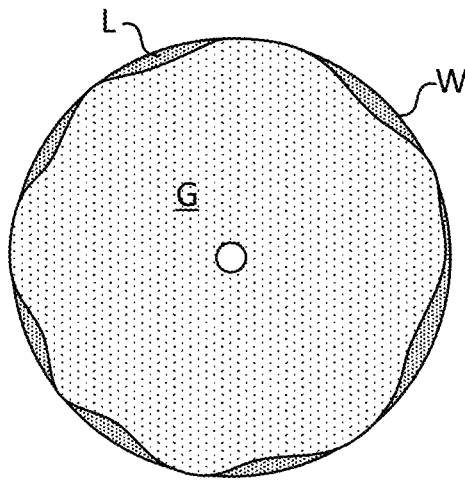
FIG. 4C illustrates improved drying of the wafer surface using the techniques described herein.

FIG. 4C illustrates improved drying of the wafer surface using the techniques described herein. In some embodiments, the pressure resistance provided by the liquid temporarily trapped or retained within the U-shaped conduit of the drainage system 190 may solve the problems shown in FIGS. 4A and 4B and enable uniform radial removal of the thin liquid film across the entire wafer. In some embodiments, a non-wetting coating layer may be provided on the upper/lower working surfaces of the chamber 105 to provide a substantially 90° contact angle between the processing liquid (L) and the upper/lower working surfaces of the chamber 105. In some embodiments, the non-wetting coating layer may be used along with the U-shaped conduit of the drainage system 190 to provide uniform drying of the wafer surface, as shown in FIG. 4C.

The non-wetting coating layer is preferably one, which provides a substantially 90° contact angle between the processing liquid (L) and the upper/lower working surfaces of the chamber 105. Since the contact angle is dependent on the particular processing liquid(s) dispensed within the chamber 105 and the coating material applied to the upper/lower working surfaces of the chamber 105, a wide variety of coating materials may be utilized. In some embodiments, the non-wetting coating layer may be a Teflon-type material, a hydrophobic material or a wide variety of other non-wetting materials that are compatible with semiconductor processing.

Figure 5:
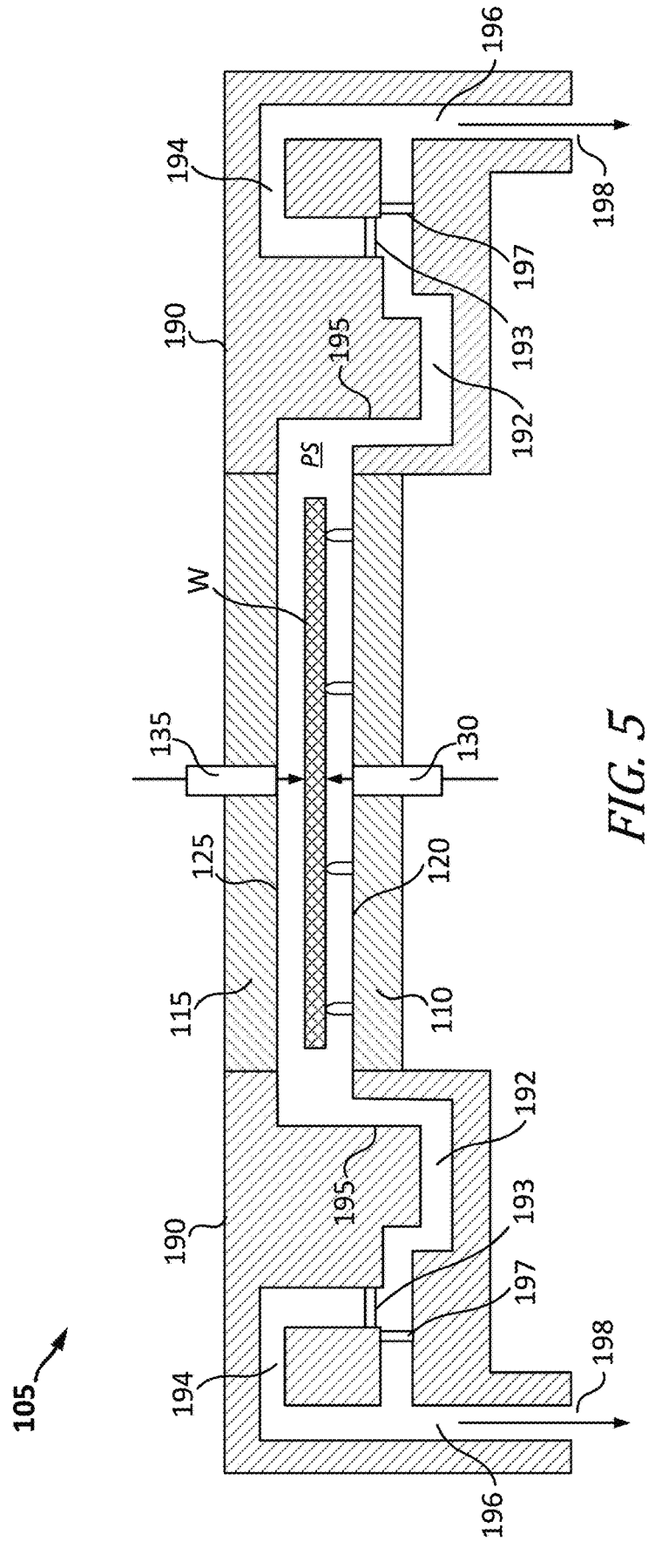
FIG. 5 is a cross-sectional view of a chamber similar to the one shown in FIG. 1A, but having an alternative drainage system.

FIG. 5 illustrates a chamber 105 design similar to the one shown in FIG. 1A, but having an alternative drainage system 190. In some embodiments, a substantially higher pressure resistance may be needed during the drying process to completely remove a processing liquid from the wafer surface(s) and uniformly dry the wafer. FIG. 5 illustrates an alternative drainage system 190 that meets this need.

Like the previous embodiment, the drainage system 190 shown in FIG. 5 contains a conduit 195 including a first portion 192, which is coupled to the processing space (PS) and positioned below the lower working surface 120 of the chamber 105. The first portion 192 of the conduit 195 may be a substantially U-shaped conduit, as shown and described above. In addition to the first portion 192, the conduit 195 shown in FIG. 5 includes a second portion 194 and a third portion 196. The second portion 194 of the conduit 195 is coupled between the first portion 192 and the third portion 196 of the conduit 195, and is positioned above the lower working surface 120 of the chamber 105. The third portion 196 of the conduit 195 is coupled to the first portion 192 of the conduit 195, the second portion 194 of the conduit 195 and an outlet 198 of the drainage system 190. The third portion 196 of the conduit 195 is positioned below the lower working surface 120 of the chamber 105. The conduit 195 shown in FIG. 5 further includes a first valve 193 positioned between the first portion 192 and the second portion 194 of the conduit 195, and a second valve 197 positioned between the first portion 192 and the third portion 196 of the conduit 195.

When a processing fluid (e.g., a cleaning solution or a rinse solution) is dispensed into the processing space (PS) during wet processing, the first valve 193 may be closed and the second valve 197 may be open to direct the processing fluid out of the processing space and sequentially through the first portion 192 and the third portion 196 of the conduit 195 to the outlet 198 of the drainage system 190. When a gas (e.g., air or nitrogen) is dispensed into the processing space (PS) during a subsequent drying process, the first valve 193 may be open and the second valve 197 may be closed to direct a remainder of the processing fluid out of the processing space and sequentially through the first portion 192, the second portion 194 and the third portion 196 of the conduit 195 to the outlet 198 of the drainage system 190. Opening the first valve 193 and closing the second valve 197 directs the processing fluid through the second portion 194 of the conduit 195, which is positioned above the lower working surface 120 of the chamber 105. This forces the processing fluid to flow upward into the second portion 194 of the conduit 195 and increases the pressure resistance against the processing fluid, ensuring that the processing liquid has to overcome a higher back pressure to exit the drainage system 190. The higher back pressure helps to provide a more uniform drying of the wafer surface(s). After the wafer surface(s) are dry, the first valve 193 and the second valve 197 may each be open to enable any remaining liquid in the conduit 195 to drain out through the outlet 198 via gravity.

A wide variety of wet and/or dry processes may be performed within the processing system 100 and chamber 105 embodiments shown in FIGS. 1A-1D, FIGS. 2A-2D and FIG. 5. For example, a cleaning process may be performed within the processing system 100 and chamber 105 shown and described herein to clean, and/or remove contaminants or residues from, one or more surfaces of a semiconductor wafer. An example cleaning process is described below. It is recognized, however, that the processing system 100 and chamber 105 shown and described herein are not limited to cleaning processes and may be utilized to perform other wet and dry processes.

Example Cleaning Process

Wafer processing in the processing system 100 and chamber 105, as shown in FIGS. 1A-1D, FIGS. 2A-2D and FIG. 5, may include wet processing followed by dry processing to clean one or more surfaces of a semiconductor wafer. In some embodiments, the wet processing may include 1) pre-wetting the wafer and the chamber inner surfaces with isopropyl alcohol (IPA). The wet processing may further include 2) treating the wafer with a chemical liquid to clean the wafer surface(s), and 3) treating the wafer with deionized (DI) water to remove the chemical liquid from the wafer and rinse the wafer surface(s). In one example, the chemical liquid removes chemical contaminants and particulate impurities from earlier wafer processing from the wafer surface. Thereafter, the dry processing includes 3) rinsing the wafer with IPA to remove the DI water from the wafer surface, and 4) drying the wafer using air or nitrogen ($N_2$). IPA has low surface tension and enables efficient wafer drying. In some embodiments, the drying process may further include treating the wafer with a supercritical fluid after rinsing the wafer with IPA and before drying the wafer with air or nitrogen.

FIG. 6 and FIGS. 7A-7D illustrate one embodiment of a processing system 100 and method 600 that utilizes the techniques described herein to process a semiconductor wafer. The processing system 100 shown in FIGS. 7A-7D may utilize any of the embodiments shown in FIGS. 1A-1D, FIGS. 2A-2D and FIG. 5 and described above. It will be recognized that the embodiments shown in FIG. 6 and FIGS. 7A-7D are merely exemplary and additional methods may utilize the techniques described herein. Further, additional processing steps may be added to the methods shown in FIG. 6 and FIGS. 7A-7D as the steps described are not intended to be exclusive. Moreover, the order of the steps is not limited to the order shown in the figures as different orders may occur and/or various steps may be performed in combination or at the same time.

The method 600 shown in FIG. 6 begins (in step 610) by inserting a semiconductor wafer into a processing space between a bottom plate having portions defining a lower working surface and a top plate having portions defining an upper working surface of an enclosed chamber. Next, the method 600 includes supporting the semiconductor wafer substantially parallel to the upper and lower working surfaces of the enclosed chamber (in step 620).

Figure 7A:
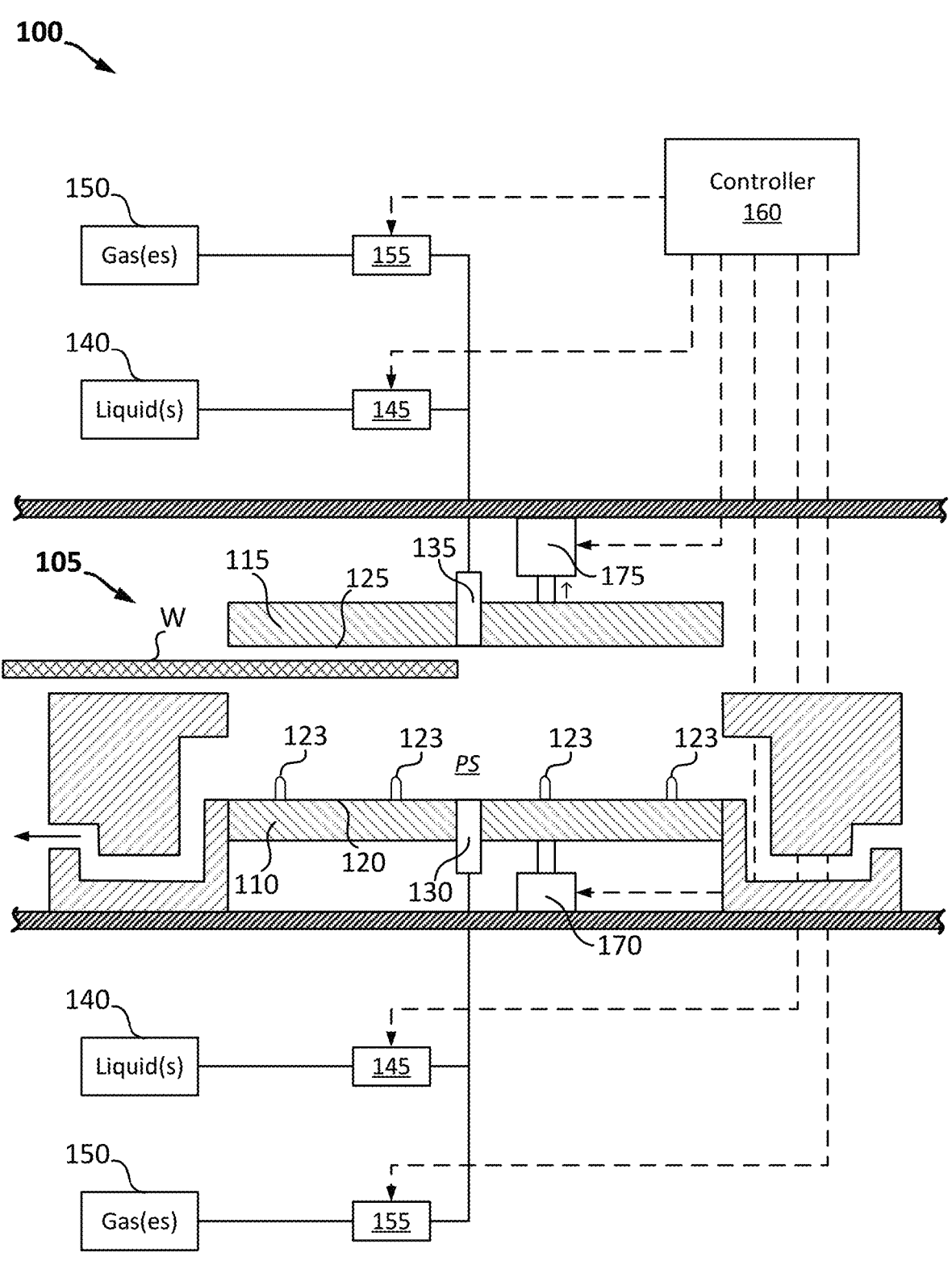
FIGS. 7A-7D illustrate one embodiment of a method for processing a semiconductor wafer within the processing system shown and described herein.
Figure 7B:
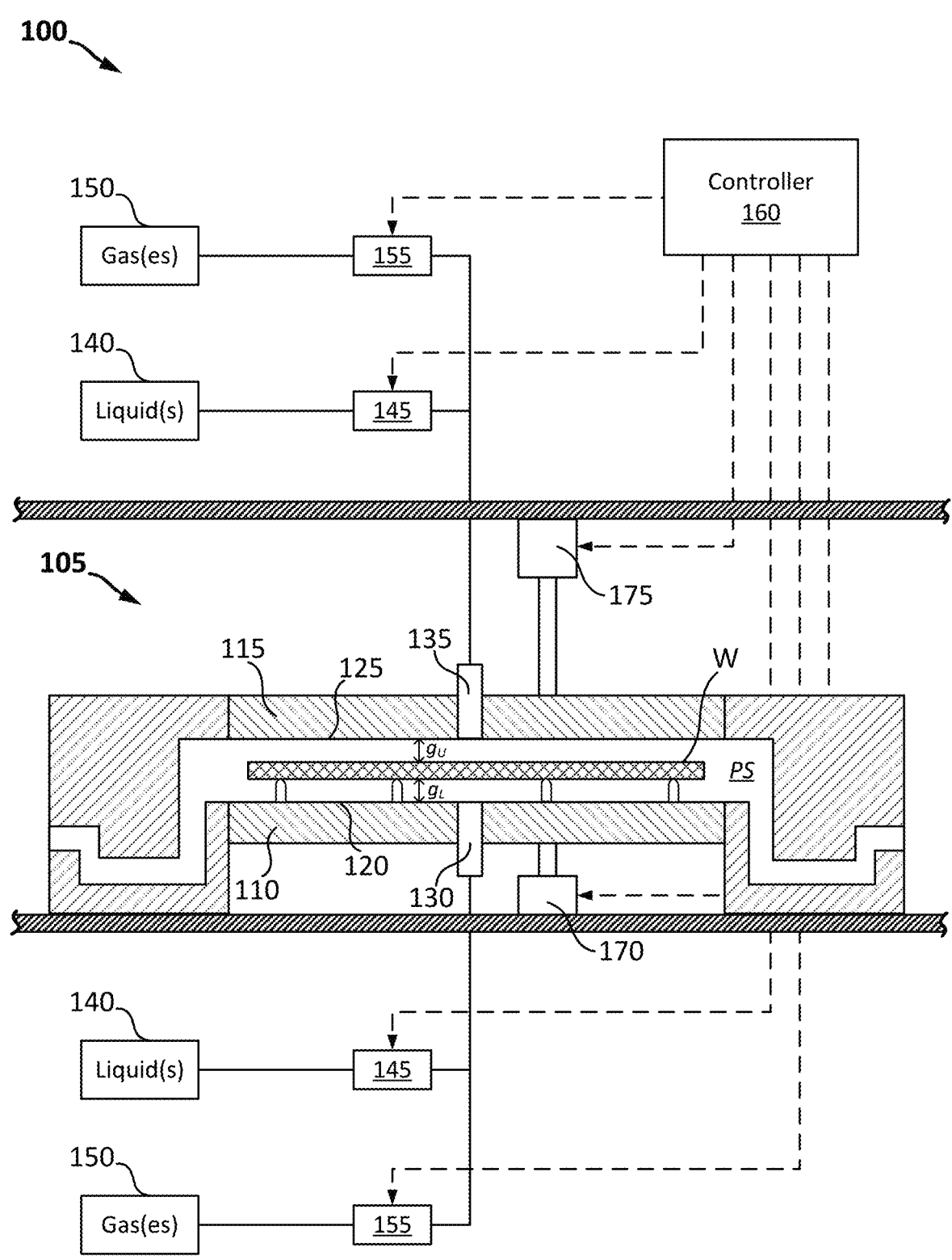

FIGS. 7A and 7B illustrate one manner in which a semiconductor wafer (W) may be inserted within a processing space (PS) (in step 610) and supported substantially parallel to the upper and lower working surfaces of the enclosed chamber 105 (in step 620). In the example embodiment shown in FIG. 7A, a control signal is supplied to the lifting mechanism 175 to raise the top plate 115, enabling the semiconductor wafer (W) to be inserted into the processing space (PS) formed between the bottom plate 110 and the top plate 115 of the chamber 105. Once inserted, the semiconductor wafer (W) is supported substantially parallel to the upper working surface 125 and the lower working surface 120 of the chamber 105. In the example embodiment shown in FIG. 7B, the semiconductor wafer (W) is supported on a plurality of pins 123, which extend from the lower working surface 120 of the enclosed chamber 105 to support the wafer from the bottom of the wafer. In other embodiments, the wafer may be supported (in step 620) by a plurality of pins 123 that support the wafer by contacting the edge of the wafer, as shown in FIG. 1D.

After the semiconductor wafer (W) is inserted within the processing space (PS) and mounted on the plurality of pins 123, a control signal may be supplied to the lifting mechanism 175 to lower the top plate 115 and enclose the chamber 105. In some embodiments, additional control signals may be supplied to the lifting mechanisms 170/175 to adjust the upper gap ($g_U$) between the upper working surface 125 of the chamber 105 and the top surface of the wafer and the lower gap ($g_L$) between the lower working surface 120 of the chamber 105 and the bottom surface of the wafer.

The method 600 shown in FIG. 6 further includes processing at least one surface of the semiconductor wafer by: (a) injecting at least one processing fluid into the processing space through at least one opening in either the top plate, the bottom plate, or both the top plate and the bottom plate of the enclosed chamber (in step 630); (b) forcing the at least one processing fluid over at least one surface of the semiconductor wafer (in step 640); and (c) directing the at least one processing fluid from the processing space through a drainage system having a conduit downstream from the processing space (in step 650). The processing fluid is directed through a conduit as shown and described herein. As such, said directing may retain a portion of the at least one processing fluid within the conduit to provide a pressure resistance against the at least one processing fluid injected into the processing space.

Figure 7C:
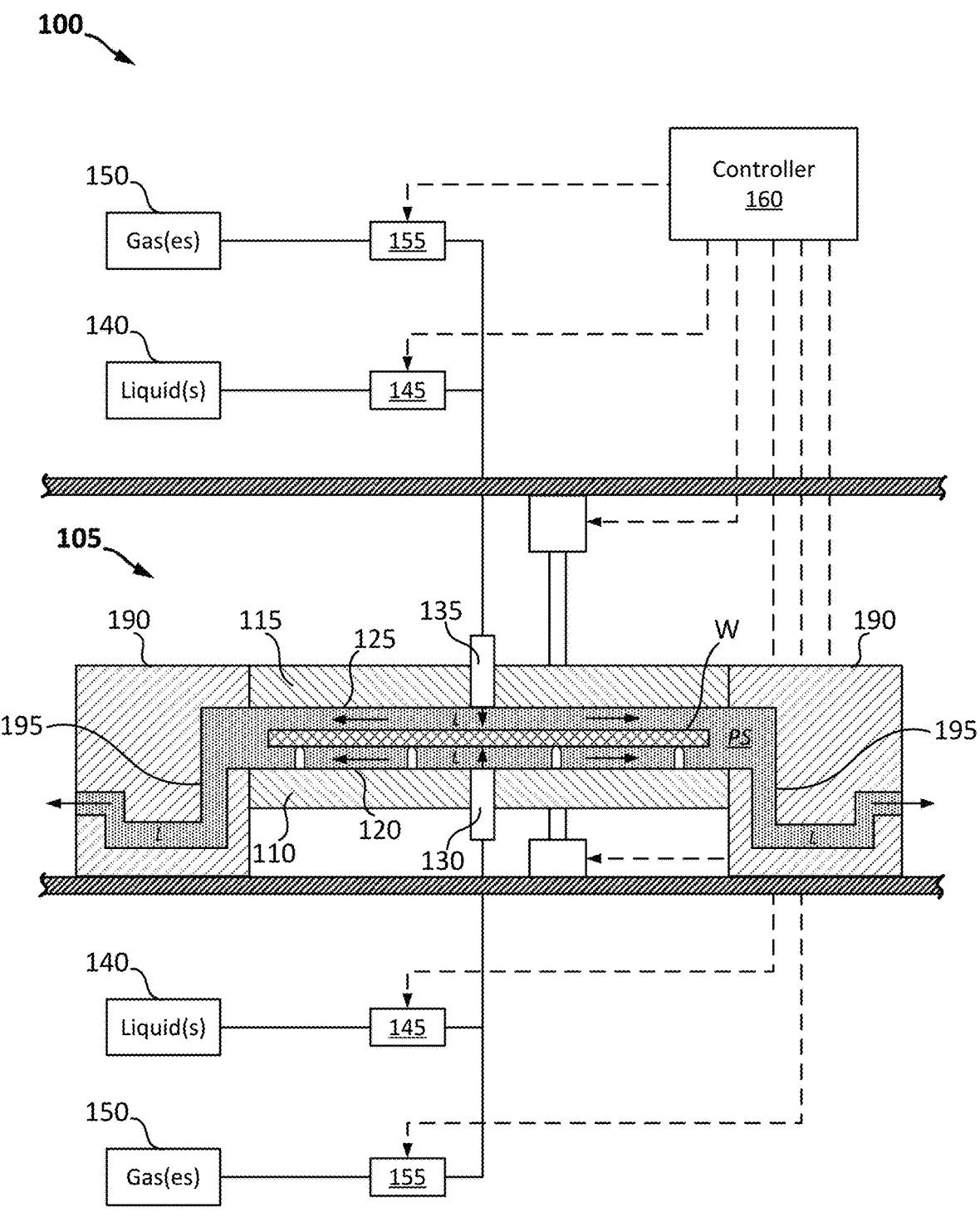
Figure 7D:
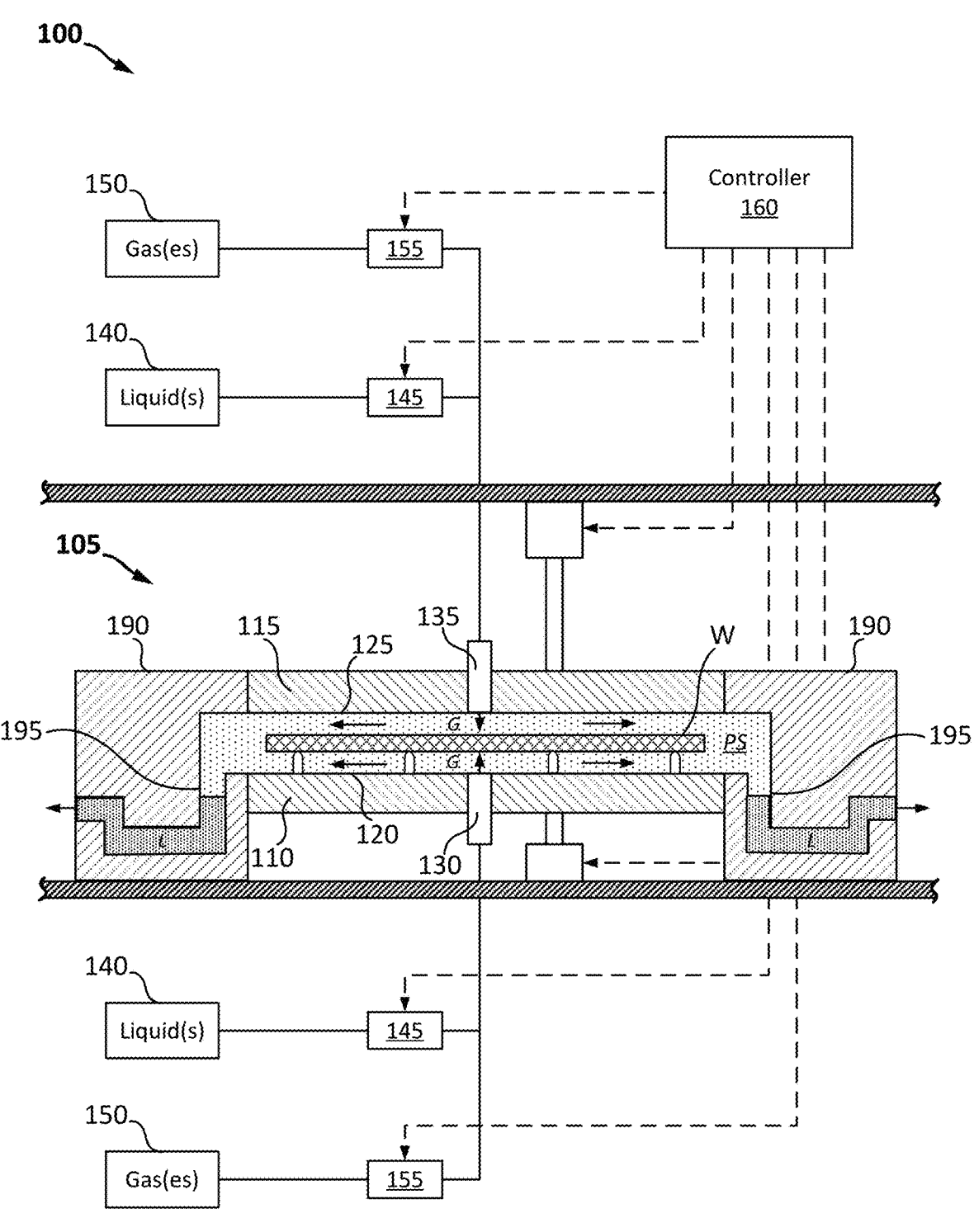

FIGS. 7C and 7D illustrate various ways in which the at least one surface of the semiconductor wafer can be processed using wet and dry processing. In the example embodiment shown in FIG. 7C, the top and bottom surfaces of the semiconductor wafer (W) are processed by injecting a liquid (L) into the processing space (PS) above/below the wafer (in step 630). In some embodiments, control signals may be supplied from the controller 160 to the liquid and gas supply valves 145/155 to selectively provide the liquid (L) into the processing space (PS). In one embodiment, the liquid (L) injected into the processing space (in step 630) may be a cleaning solution and/or a rinse solution used for cleaning and/or rinsing at least one surface of the semiconductor wafer (W), as set forth above. However, other liquids may also be injected into the processing space (in step 630).

In some embodiments, additional processing step(s) not shown in FIG. 6 may be performed before injecting the liquid (L) into the processing space (in step 630). For example, the method 600 may further include injecting a low surface tension liquid (e.g., IPA) into the processing space to pre-wet the wafer surfaces, the upper working surface 125 and the lower working surface 120 of the chamber 105. The low surface tension liquid injected into the processing space may prevent air bubble formation on the wafer surfaces when the liquid is subsequently injected into the processing space (in step 630).

In the embodiment shown in FIG. 7C, the liquid (L) injected into the processing space (PS) is forced over the top and bottom surfaces of the semiconductor wafer (in step 640) and spreads radially across the wafer surfaces, from the center of the wafer (when a center nozzle is used) to the edge of the wafer. The liquid (L) is then directed through the conduit 195, which is downstream from the processing space (in step 650). As shown in FIG. 7A, directing the liquid through the conduit 195 retains a portion of the liquid within the conduit 195 to provide a pressure resistance against the liquid being injected into the processing space. This pressure resistance improves wetting of the wafer surfaces by providing a uniform fluid velocity of the liquid radially across the top and bottom surfaces of the wafer.

In the example embodiment shown in FIG. 7D, the top and bottom surfaces of the semiconductor wafer (W) are processed by injecting a gas (G) into the processing space (PS) above/below the wafer (in step 630). The gas (G) is injected into the processing space, after injecting the liquid (L), to remove the liquid from the top and bottom surfaces of the wafer and dry the wafer surfaces. In some embodiments, control signals may be supplied from the controller 160 to the liquid and gas supply valves 145/155 to selectively provide the gas (G) into the processing space (PS). In one embodiment, air, nitrogen or other inert gases may be injected into the processing space (in step 630) to dry the wafer surfaces.

In the embodiment shown in FIG. 7D, the gas (G) injected into the processing space (PS) is forced over the top and bottom surfaces of the semiconductor wafer (in step 640) and spreads radially across the wafer surfaces, from the center of the wafer (when a center nozzle is used) to the edge of the wafer. The portion of the liquid (L) retained within the conduit 195 provides a pressure resistance against the gas (G) injected into the processing space by filling at least a portion of the conduit 195. The liquid-filled portion of the conduit 195 seals an atmosphere in the processing space from an atmosphere downstream from the liquid-filled portion of the conduit 195. This increases the gas pressure within the processing space, which results in smooth and uniform flow of the gas across the wafer surface(s), from the center of the wafer to the edge of the wafer. This improves drying of the wafer surfaces by providing a more uniform radial removal of the liquid (L) from the wafer surfaces.

In some embodiments, the conduit 195 may include a first portion 192, a second portion 194, a third portion 196, a first valve 193 and a second valve 197, as shown in the embodiment of FIG. 5 and discussed above. In such embodiments, the method 600 shown in FIG. 6 may further include controlling a position of the first valve 193 and the second valve 197 during one or more processing steps to direct the at least one processing fluid through the drainage system 190 (in step 640).

During a first processing step, for example, the method 600 may include: (a) injecting a liquid (L) into the processing space (PS) to clean or rinse the at least one surface of the semiconductor wafer; (b) closing the first valve 193 and opening the second valve 197 to direct the liquid out of the processing space and through the first portion 192 and the third portion 196 of the conduit 195 to the outlet 198 of the drainage system 190; and (c) retaining a portion of the liquid (L) within the first portion 192 of the conduit 195 to provide a pressure resistance against the liquid injected into the processing space. This pressure resistance improves wetting of the wafer surface(s) by providing a uniform fluid velocity of the liquid radially across the wafer surface(s).

During a second processing step performed after the first processing step, the method 600 may further include: (a) injecting a gas (G) into the processing space (PS) to dry the at least one surface of the semiconductor wafer; and (b) opening the first valve 193 and closing the second valve 197 to direct the liquid out of the processing space and through the first portion 192, the second portion 194 and the third portion 196 of the conduit 195 to the outlet 198 of the drainage system 190. The portion of the liquid retained within the first portion 192 of the conduit 195 provides a pressure resistance against the gas injected into the processing space. This pressure resistance improves drying of the wafer surface(s) by providing a more uniform radial removal of the liquid (L) from the wafer surface(s).

In some embodiments, additional processing step(s) not shown in FIG. 6 may be performed after the liquid (L) is injected into the processing space to process the wafer surfaces and before the gas (G) is injected into the processing space to dry the wafer surfaces. In one embodiment, the liquid (L) injected into the processing space may be a cleaning solution used to clean the wafer surfaces. Examples of cleaning solutions are provided above. After a cleaning solution is injected into the processing space, a rinse solution may be injected into the processing space to remove the cleaning solution and rinse the wafer surfaces. The rinse solution may be deionized water, in one embodiment. Next, a low surface tension liquid (such as, e.g., IPA) may be injected into the processing space to remove the rinse solution from the wafer surface before the gas (G) is injected into the processing space to dry the wafer surfaces. IPA has a relatively low surface tension, which enables more efficient wafer drying.

In some embodiments, additional processing step(s) may be utilized to improve wafer drying and avoid the pattern collapse that sometimes occurs when using IPA to dry wafer surfaces. For example, after a low surface tension liquid is injected into the processing space (PS), the wafer surfaces may be treated with a supercritical fluid such as, e.g., supercritical carbon dioxide ($CO_2$) before drying the wafer surfaces. Since supercritical fluids have zero surface tension, pattern collapse does not occur when the wafer is dried in a supercritical fluid environment.

Figure 8:
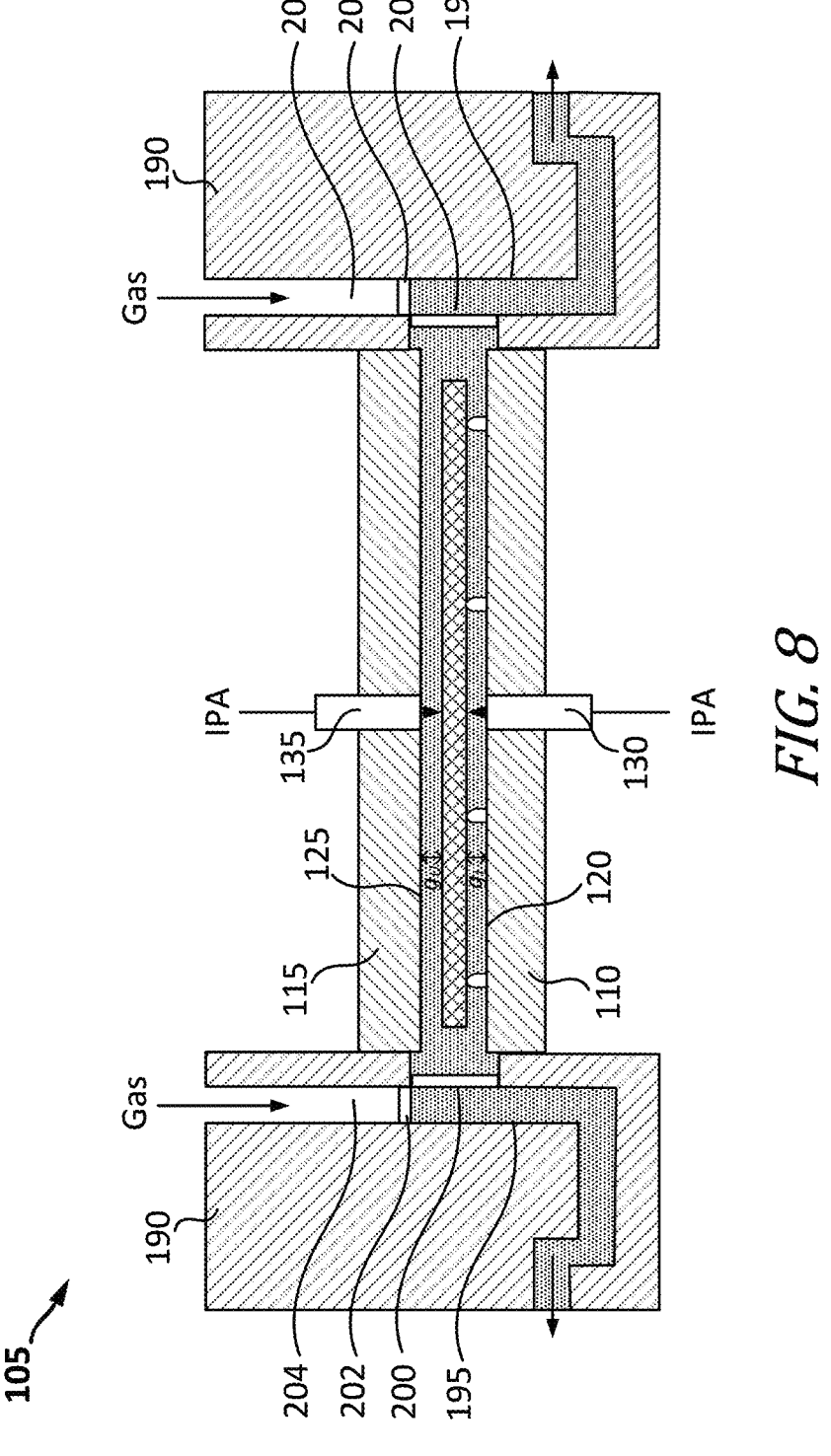
FIG. 8 is a cross-sectional view of a chamber similar to the chamber shown in FIG. 1A, but having additional features that enable supercritical processing to be performed within the chamber.

FIG. 8 illustrates a chamber 105 design similar to the one shown in FIG. 1A, but having additional features that enable supercritical processing to be performed within the chamber 105. In the embodiment shown in FIG. 8, a first set of valves 200 is provided within the chamber 105 between the processing space (PS) and the drainage system 190. The first set of valves 200 may be closed to seal processing fluid(s) within the processing space (PS), as shown in FIG. 8, or opened to allow the processing fluid(s) to drain out of the processing space through the conduits 195 contained within the drainage system 190. A second set of valves 202 is provided within the chamber 105 between the gas inlets 204 and the conduits 195 contained within the drainage system 190. The second set of valves 202 may be closed when injecting processing fluid(s) into the processing space (PS), as shown in FIG. 8, or opened to allow a gas (such as, e.g., air or nitrogen) injected into the gas inlets 204 to push any remaining processing fluid(s) through the conduits 195 and out of the drainage system 190.

In some embodiments of the method described herein, wafer surfaces may be treated with a supercritical fluid within the chamber 105 shown in FIG. 8 after the low surface tension liquid (such as, e.g., IPA) is injected into the processing space to remove the rinse solution from the wafer surfaces. In some embodiments, the first set of valves 200 shown in FIG. 8 may be closed to seal the low surface tension liquid within the chamber 105 before a supercritical fluid (e.g., supercritical $CO_2$) is injected into the processing space (PS). In some embodiments of the method described herein, a vertical position of the top plate 115 and the bottom plate 110 may be adjusted to reduce the gap (g) between the top and bottom plates and decrease an amount of the low surface tension liquid on the wafer surfaces before the wafer surfaces are treated with the supercritical fluid. Decreasing the amount of low surface tension liquid on the wafer surfaces provides the advantage of reducing or eliminating defects that may otherwise occur when the low surface tension liquid merges with the supercritical fluid.

Systems and methods for processing a semiconductor wafer (e.g., a substrate) are described in various embodiments. The substrate may include any material portion or structure of a device, particularly a semiconductor or other electronics device, and may, for example, be a base substrate structure, such as a semiconductor substrate or a layer on or overlying a base substrate structure. Thus, the term "substrate" is not intended to be limited to any particular base structure, underlying layer or overlying layer, patterned layer or unpatterned layer, but rather, is contemplated to include any such layer or base structure, and any combination of layers and/or base structures.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the systems and methods described herein will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method for processing a semiconductor wafer, the method comprising:
   inserting the semiconductor wafer into a processing space between a bottom plate having portions defining a lower working surface and a top plate having portions defining an upper working surface of an enclosed chamber;
   supporting the semiconductor wafer substantially parallel to the upper and lower working surfaces; and
   processing at least one surface of the semiconductor wafer by:

injecting at least one processing fluid into the processing space through at least one opening in either the top plate, the bottom plate, or both the top plate and the bottom plate;
   forcing the at least one processing fluid over at least one surface of the semiconductor wafer; and
   directing the at least one processing fluid from the processing space through a drainage system having a U-shaped conduit downstream from the processing space, the U-shaped conduit being positioned below the lower working surface, wherein said directing retains a portion of the at least one processing fluid within the U-shaped conduit to provide a pressure resistance against the at least one processing fluid injected into the processing space; and
   draining the at least one processing fluid through the U-shaped conduit from an outlet of the U-shaped conduit, the outlet being arranged below the processing space.

2. The method of claim 1, wherein said injecting the at least one processing fluid includes injecting a liquid into the processing space to process the at least one surface of the semiconductor wafer.

3. The method of claim 2, wherein said directing retains a portion of the liquid within the U-shaped conduit to provide a pressure resistance against the liquid injected into the processing space, and wherein the pressure resistance provides a uniform fluid velocity of the liquid radially across the at least one surface of the semiconductor wafer.

4. The method of claim 2, wherein before injecting the liquid into the processing space, the method further comprises:
   injecting a low surface tension liquid into the processing space to pre-wet the at least one surface of the semiconductor wafer, the upper working surface and the lower working surface;
   wherein the low surface tension liquid injected into the processing space prevents air bubble formation on the at least one surface of the semiconductor wafer when the liquid is subsequently injected into the processing space.

5. The method of claim 2, wherein said injecting the at least one processing fluid further includes injecting a gas into the processing space, after injecting the liquid, to dry the at least one surface of the semiconductor wafer.

6. The method of claim 5, wherein said directing retains a portion of the liquid within the U-shaped conduit to provide a pressure resistance against the gas injected into the processing space, and wherein the pressure resistance provides uniform drying of the at least one surface of the semiconductor wafer.

7. The method of claim 2, wherein after said injecting the liquid into the processing space, the method further comprises:
   injecting a rinse solution into the processing space to remove the liquid and rinse the at least one surface of the semiconductor wafer;
   injecting a low surface tension liquid into the processing space to remove the rinse solution from the at least one surface of the semiconductor wafer;
   adjusting a vertical position of the top plate and the bottom plate to reduce a gap between the top plate and the bottom plate and decrease an amount of the low surface tension liquid on the at least one surface of the semiconductor wafer; and
   treating the at least one surface of the semiconductor wafer with a supercritical fluid.

8. A method for processing a semiconductor wafer, the method comprising:

inserting the semiconductor wafer into a processing space between a bottom plate having portions defining a lower working surface and a top plate having portions defining an upper working surface of an enclosed chamber;

supporting the semiconductor wafer substantially parallel to the upper and lower working surfaces; and processing at least one surface of the semiconductor wafer by:

injecting at least one processing fluid into the processing space through at least one opening in either the top plate, the bottom plate, or both the top plate and the bottom plate;

forcing the at least one processing fluid over at least one surface of the semiconductor wafer; and directing the at least one processing fluid from the processing space through a drainage system having a U-shaped conduit downstream from the processing space, wherein said directing retains a portion of the at least one processing fluid within the U-shaped conduit to provide a pressure resistance against the at least one processing fluid injected into the processing space; and draining the at least one processing fluid through the U-shaped conduit from an outlet of the U-shaped conduit, the outlet being arranged below the processing space, wherein said directing retains a portion of the liquid within the U-shaped conduit to provide a pressure resistance against the liquid injected into the processing space, and wherein the pressure resistance provides a uniform fluid velocity of the liquid radially across the at least one surface of the semiconductor wafer.

9. The method of claim 8, wherein the U-shaped conduit comprises:

a first portion that is coupled to the processing space and positioned below the lower working surface, wherein the first portion of the U-shaped conduit comprises a U-shaped section, which is configured to retain the portion of the processing fluid to provide the pressure resistance against the processing fluid directed into the processing space;

a second portion positioned above the lower working surface; and a third portion positioned below the lower working surface, wherein the second portion of the U-shaped conduit is coupled between the first portion of the U-shaped conduit and the third portion of the U-shaped conduit, and wherein the third portion of the U-shaped conduit is coupled to the first portion of the U-shaped conduit, the second portion of the conduit and an outlet of the U-shaped conduit drainage system.

10. The method of claim 9, wherein the U-shaped conduit further comprises:

a first valve positioned between the first portion of the U-shaped conduit and the second portion of the U-shaped conduit; and a second valve positioned between the first portion of the U-shaped conduit and the third portion of the U-shaped conduit;

wherein when the first valve is open and the second valve is closed, the U-shaped conduit is configured to direct the processing fluid out of the processing space and sequentially through the first portion, the second portion and the third portion of the U-shaped conduit to the outlet of the U-shaped conduit.

11. The method of claim 9, wherein said injecting the at least one processing fluid includes injecting a liquid into the processing space to process the at least one surface of the semiconductor wafer.

12. The method of claim 11, wherein said injecting the at least one processing fluid further includes injecting a gas into the processing space, after injecting the liquid, to dry the at least one surface of the semiconductor wafer.

13. The method of claim 12, wherein said directing retains a portion of the liquid within the U-shaped conduit to provide a pressure resistance against the gas injected into the processing space, and wherein the pressure resistance provides uniform drying of the at least one surface of the semiconductor wafer.

14. The method of claim 8, wherein said injecting the at least one processing fluid includes injecting a liquid into the processing space to process the at least one surface of the semiconductor wafer.

15. The method of claim 14, wherein before injecting the liquid into the processing space, the method further comprises:

injecting a low surface tension liquid into the processing space to pre-wet the at least one surface of the semiconductor wafer, the upper working surface and the lower working surface;

wherein the low surface tension liquid injected into the processing space prevents air bubble formation on the at least one surface of the semiconductor wafer when the liquid is subsequently injected into the processing space.

16. The method of claim 14, wherein said injecting the at least one processing fluid further includes injecting a gas into the processing space, after injecting the liquid, to dry the at least one surface of the semiconductor wafer.

17. The method of claim 16, wherein said directing retains a portion of the liquid within the U-shaped conduit to provide a pressure resistance against the gas injected into the processing space, and wherein the pressure resistance provides uniform drying of the at least one surface of the semiconductor wafer.

18. The method of claim 11, wherein after said injecting the liquid into the processing space, the method further comprises:

injecting a rinse solution into the processing space to remove the liquid and rinse the at least one surface of the semiconductor wafer;

injecting a low surface tension liquid into the processing space to remove the rinse solution from the at least one surface of the semiconductor wafer;

adjusting a vertical position of the top plate and the bottom plate to reduce a gap between the top plate and the bottom plate and decrease an amount of the low surface tension liquid on the at least one surface of the semiconductor wafer; and treating the at least one surface of the semiconductor wafer with a supercritical fluid.

* * * * *